(12) United States Patent
Miyauchi

(10) Patent No.: US 11,928,843 B2
(45) Date of Patent: Mar. 12, 2024

(54) SIGNAL PROCESSING APPARATUS AND SIGNAL PROCESSING METHOD

(71) Applicant: CANON KABUSHIKI KAISHA, Tokyo (JP)

(72) Inventor: Dai Miyauchi, Chiba (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 586 days.

(21) Appl. No.: 17/108,538

(22) Filed: Dec. 1, 2020

(65) Prior Publication Data

US 2021/0166434 A1 Jun. 3, 2021

(30) Foreign Application Priority Data

Dec. 3, 2019 (JP) ................................ 2019-219076

(51) Int. Cl.
*G06T 9/00* (2006.01)
*G06N 3/084* (2023.01)
(Continued)

(52) U.S. Cl.
CPC ............. *G06T 9/002* (2013.01); *G06N 3/084* (2013.01); *G06T 3/4046* (2013.01);
(Continued)

(58) Field of Classification Search
CPC ....... G06T 9/002; G06T 3/4046; G06N 3/084; G06N 3/045; H03M 7/3059;
(Continued)

(56) References Cited

U.S. PATENT DOCUMENTS 5,841,904 A * 11/1998 Sugiura .................... H04N 1/64
382/233
5,861,922 A * 1/1999 Murashita ............ H04N 19/126
375/E7.199
(Continued)

FOREIGN PATENT DOCUMENTS

JP 04-302272 A 10/1992
JP 2007-013398 A 1/2007
(Continued)

OTHER PUBLICATIONS

The above patent documents were cited in a Japanese Office Action dated Dec. 25, 2023, which is enclosed, without translation, that issued in the corresponding Japanese Patent Application No. 2019-219076.

*Primary Examiner* — Charles T Shedrick
(74) *Attorney, Agent, or Firm* — Cowan, Liebowitz & Latman, P.C.

(57) ABSTRACT

A signal processing apparatus comprises a decoding unit configured to generate a decoded image by decoding lossy compressed image data, and a restoration processing unit configured to perform image restoration processing on the decoded image. The restoration processing unit determines whether or not to perform the restoration processing for each of blocks in the decoded image in accordance with specific image information, and for a block on which it is determined that the restoration processing is to be performed, performs the restoration processing on the basis of an inference made using a coefficient learned in advance.

18 Claims, 22 Drawing Sheets

(51) Int. Cl.
    *G06T 3/40*     (2006.01)
    *H03M 7/30*     (2006.01)

(52) U.S. Cl.
    CPC ....... *H03M 7/3059* (2013.01); *H03M 7/3066* (2013.01); *H03M 7/6005* (2013.01); *H03M 7/6011* (2013.01)

(58) Field of Classification Search
    CPC ............. H03M 7/3066; H03M 7/6005; H03M 7/6011; H04N 19/124; H04N 19/154; H04N 19/176; H04N 19/44
    See application file for complete search history.

(56) References Cited

U.S. PATENT DOCUMENTS

| | | | | |
|---|---|---|---|---|
| 11,218,695 | B2 * | 1/2022 | Park | H04N 19/65 |
| 2009/0304255 | A1 * | 12/2009 | Hagiwara | H04N 19/172 |
| | | | | 382/128 |
| 2010/0135415 | A1 * | 6/2010 | Song | H04N 19/15 |
| | | | | 375/E7.076 |
| 2010/0322303 | A1 * | 12/2010 | Wada | H04N 19/51 |
| | | | | 375/E7.026 |
| 2012/0002863 | A1 * | 1/2012 | Lim | H04N 13/106 |
| | | | | 382/154 |
| 2019/0104309 | A1 * | 4/2019 | Su | H04N 19/36 |
| 2020/0161005 | A1 * | 5/2020 | Lyman | G16H 10/60 |
| 2021/0166434 | A1 * | 6/2021 | Miyauchi | H04N 19/124 |
| 2022/0007023 | A1 * | 1/2022 | Sim | H04N 19/124 |

FOREIGN PATENT DOCUMENTS

| | | | |
|---|---|---|---|
| JP | 2015-225469 A | | 12/2015 |
| JP | 2019-087778 A | | 6/2019 |
| JP | 2021090129 A | * | 6/2021 |
| WO | 2010/026770 A | | 3/2010 |

* cited by examiner

FIG. 15
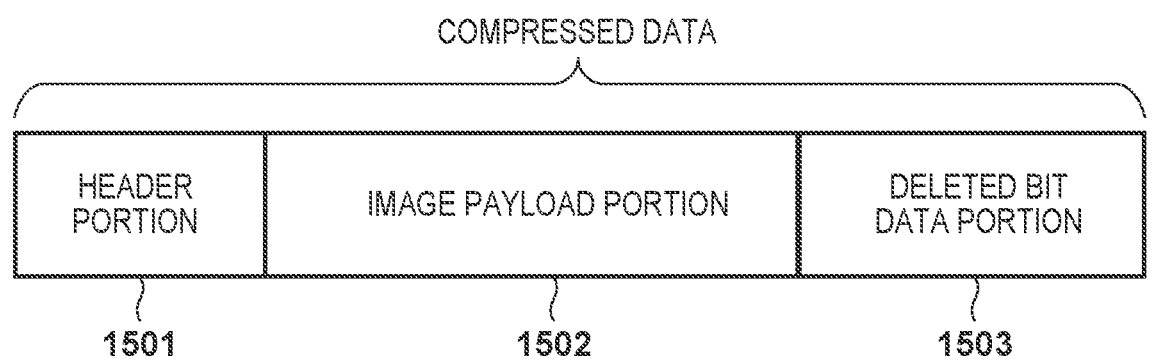
FIG. 16A  FIG. 16B
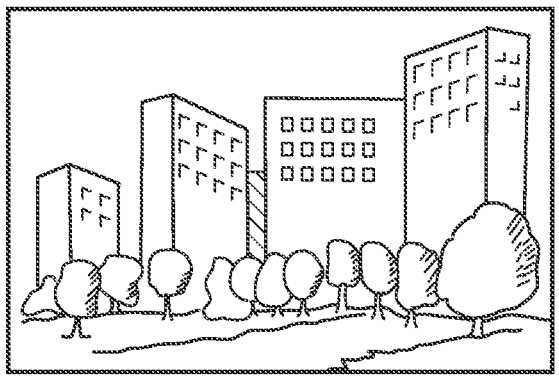
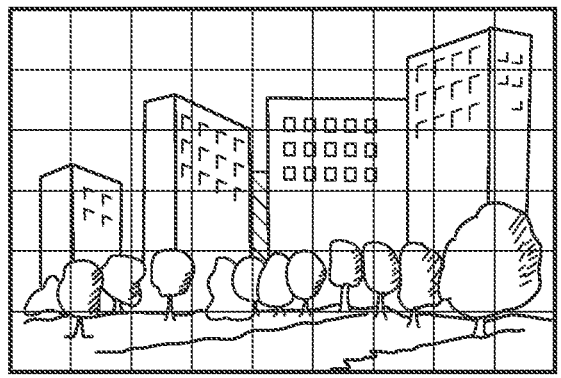

F I G. 16C

<table>
<tr><td>3</td><td>3</td><td>3</td><td>3</td><td>3</td><td>3</td><td>2</td><td>3</td><td>2</td></tr>
<tr><td>3</td><td>3</td><td>3</td><td>3</td><td>3</td><td>3</td><td>2</td><td>3</td><td>2</td></tr>
<tr><td>3</td><td>3</td><td>3</td><td>3</td><td>3</td><td>2</td><td>2</td><td>2</td><td>2</td></tr>
<tr><td>3</td><td>3</td><td>3</td><td>3</td><td>3</td><td>1</td><td>1</td><td>1</td><td>1</td></tr>
<tr><td>3</td><td>3</td><td>3</td><td>3</td><td>3</td><td>1</td><td>3</td><td>1</td><td>1</td></tr>
<tr><td>3</td><td>3</td><td>2</td><td>2</td><td>2</td><td>1</td><td>2</td><td>1</td><td>1</td></tr>
<tr><td>2</td><td>2</td><td>2</td><td>2</td><td>2</td><td>1</td><td>3</td><td>1</td><td>1</td></tr>
<tr><td>3</td><td>3</td><td>3</td><td>2</td><td>2</td><td>0</td><td>3</td><td>0</td><td>1</td></tr>
<tr><td>3</td><td>3</td><td>3</td><td>2</td><td>1</td><td>3</td><td>3</td><td>0</td><td>1</td></tr>
</table>

DECODED BLOCK OF INTEREST

F I G. 16D

| PIXEL VALUE BEFORE MASKING | 1 | 0 | 0 | 1 | 0 | 1 | 0 | 1 | EXAMPLE OF PIXEL INCLUDED IN DECODED IMAGE BLOCK OF INTEREST |
| PIXEL VALUE AFTER MASKING | 0 | 0 | 0 | X | X | X | X | X | |
| PIXEL VALUE AFTER INVERSE PROCESSING | 1 | 0 | 1 | X | X | X | X | X | X: DETERMINE DEPENDING ON SPECIFIED COEFFICIENT PARAMETER |

MASKING TARGET BIT OF DECODED BLOCK OF INTEREST

FIG. 18

| 1 | 0 | 0 | 1 | 0 | 1 | 1 |
|---|---|---|---|---|---|---|
| 1 | 0 | 1 | 1 | 0 | 0 | 0 |

PIXEL VALUES OF ORIGINAL IMAGE BLOCK

PIXEL VALUES OF LOCALLY-DECODED IMAGE BLOCK

TWO MOST SIGNIFICANT BITS ARE SAME

FIG. 23

| PIXEL VALUE BEFORE MASKING | 1 | 1 | 1 | 1 | 1 | 1 | 1 | 1 |
|---|---|---|---|---|---|---|---|---|
| PIXEL VALUE AFTER MASKING (M = 1) | 1 | 1 | 1 | 1 | 1 | 1 | 1 | 0 |
| PIXEL VALUE AFTER MASKING (M = 2) | 1 | 1 | 1 | 1 | 1 | 1 | 0 | 0 |
| PIXEL VALUE AFTER MASKING (M = 3) | 1 | 1 | 1 | 1 | 1 | 0 | 0 | 0 |

SIGNAL PROCESSING APPARATUS AND SIGNAL PROCESSING METHOD

BACKGROUND OF THE INVENTION

Field of the Invention

The present invention relates to a signal processing technique which decodes compressed image data and restores the image quality of the decoded image.

Description of the Related Art

Deep learning techniques using neural networks are recently being applied in a wide range of technical fields, and enhancing the quality of images is one such application. To increase the number of images which can be shot by a digital camera or the like, captured image data is compressed before being recorded. There is a tradeoff between the image quality and the data size, and the image quality decreases the more the data size is reduced through higher rates of compression. Therefore, applying deep learning-based image quality enhancement processing to a decoded image obtained by decoding compressed image data is one possible method for reducing a drop in subjective image quality at higher compression rates.

However, the time required to perform image restoration processing (i.e., inferencing processing) using deep learning cannot be ignored, and using deeper networks to improve the image restoration performance results in longer processing times, adding to the stress of users. Note that because the purpose of the deep learning is image restoration, "inferencing processing" and "image restoration processing" will be treated as being equivalent concepts.

Aside from the method of deepening the network, it is also known that image restoration performance can be increased by learning each of features of the subject of the image restoration and performing the image restoration processing using coefficient parameters learned in advance for each feature.

Japanese Patent Laid-Open No. H4-302272 discloses a technique in which coefficient parameters for improving decoded image quality are learned for each of quantization tables used in compression, and image restoration processing is performed having selected coefficient parameters learned with the quantization table actually used in the encoding. According to Japanese Patent Laid-Open No. H4-302272, the restoration performance can be increased by performing image restoration processing using coefficient parameters specialized for each quantization table.

Meanwhile, deep learning techniques can perform inferencing processing with greater accuracy as the number of patterns to be learned decreases. To take image recognition, where deep learning techniques are widely applied, as an example, recognizing dogs and cats requires a more complex neural network model to ensure performance than recognizing dogs only. Mapping this example onto image restoration processing, the pattern to be learned can be said to be the number of patterns in the images, which is a pattern in which pixel values are arranged. In other words, although an infinite number of images can exist, image restoration becomes easier as the number of types of images to be learned decreases, i.e., image restoration becomes easier for images having lower bit depths.

Japanese Patent Laid-Open No. 2015-225469 discloses a technique that reduces the size of a lookup table used in a weak determining unit by applying a predetermined bit mask to a feature image representing an image feature, selecting a bit with a high capability for object identification as a feature amount, and encoding the feature amount. According to Japanese Patent Laid-Open No. 2015-225469, the number of parameters required for object detection based on machine learning can be reduced.

However, although using the technique disclosed in Japanese Patent Laid-Open No. H4-302272 enhances the restoration performance, the technique cannot shorten the time required for the inferencing processing. In addition, even if the technique of Japanese Patent Laid-Open No. 2015-225469 is used, the number of patterns in the image cannot be reduced, and the image restoration performance therefore cannot be improved.

SUMMARY OF THE INVENTION

The present invention has been made in consideration of the aforementioned problems, and realizes a technique that reduces the time required for image restoration processing and improves the image quality after the image restoration.

In order to solve the aforementioned problems, the present invention provides a signal processing apparatus comprising: a decoding unit configured to generate a decoded image by decoding lossy compressed image data; and a restoration processing unit configured to perform image restoration processing on the decoded image, wherein the restoration processing unit determines whether or not to perform the restoration processing for each of blocks in the decoded image in accordance with specific image information, and for a block on which it is determined that the restoration processing is to be performed, performs the restoration processing on the basis of an inference made using a coefficient learned in advance.

In order to solve the aforementioned problems, the present invention provides a learning method of a neural network, the method comprising: learning a coefficient used by a neural network that generates an image having a restored image quality by restoring an image quality of a first decoded image obtained by decoding lossy compressed image data; and generating the coefficient through learning based on a second decoded image obtained by manipulating a predetermined bit and reducing an amount of information in the first decoded image, and a second original image obtained by manipulating a predetermined bit and reducing an amount of information in a first original image, the first original image being an image before the lossy compression.

In order to solve the aforementioned problems, the present invention provides a signal processing method comprising: generating a decoded image by decoding lossy compressed image data; and performing image restoration processing on the decoded image, wherein in the restoration processing, it is determined whether or not to perform the restoration processing for each of blocks in the decoded image in accordance with specific image information, and for a block on which it is determined that the restoration processing is to be performed, the restoration processing is performed on the basis of an inference made using a coefficient learned in advance.

According to the present invention, the time required for image restoration processing can be reduced, and the image quality after the image restoration can be improved.

Further features of the present invention will become apparent from the following description of exemplary embodiments (with reference to the attached drawings).

BRIEF DESCRIPTION OF THE DRAWINGS

FIG. 15 is a diagram illustrating the data structure of compressed data according to the ninth embodiment.

FIGS. 16A to 16D are diagrams illustrating an example of deleted bits and image processing according to the ninth embodiment.

FIG. 18 is a diagram illustrating an example of locally-decoded block and original image block pixel values according to the ninth embodiment.

FIG. 23 is a diagram illustrating an example of an LSB mask according to the tenth embodiment.

DESCRIPTION OF THE EMBODIMENTS

Figure 1:
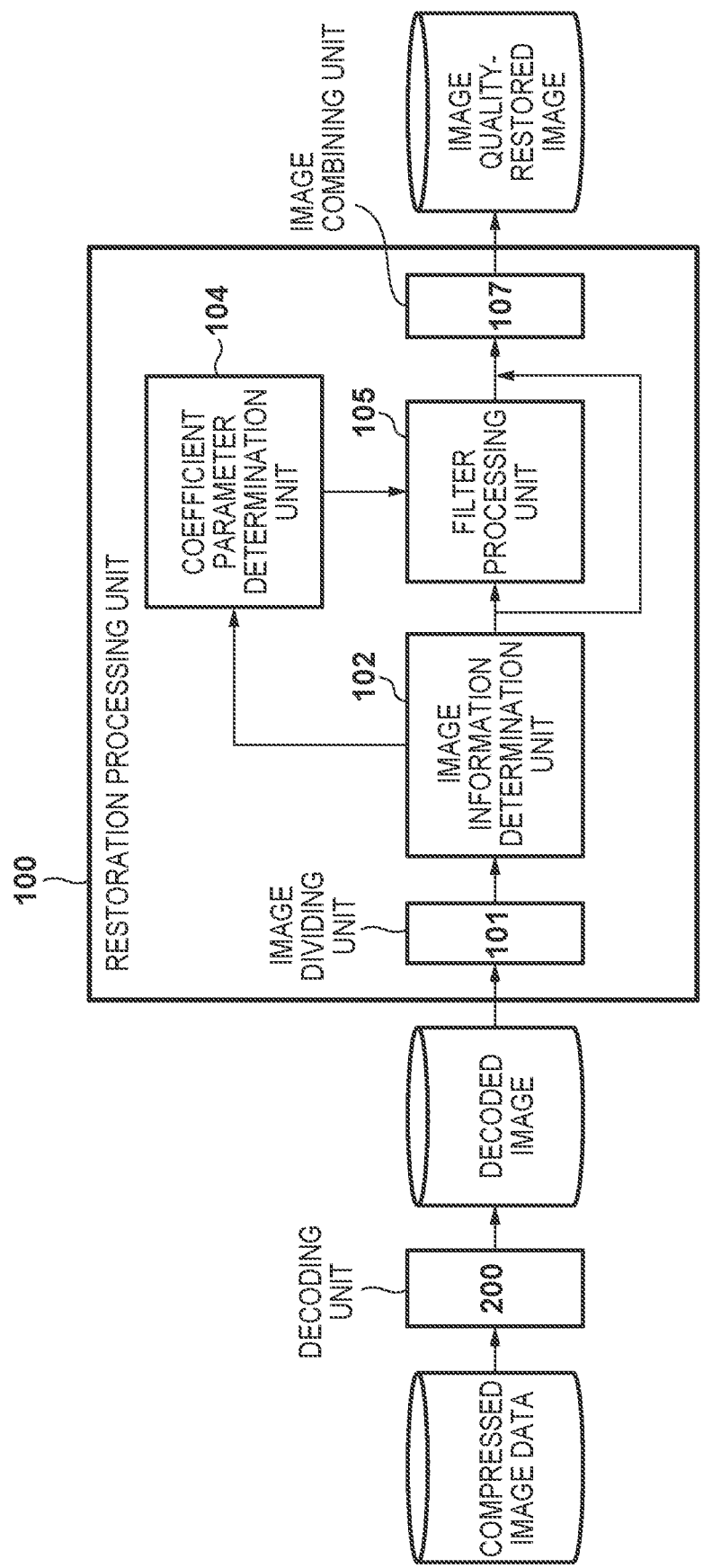
FIG. 1 is a block diagram illustrating an example of a configuration of a signal processing apparatus according to a first embodiment.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

The signal processing apparatus according to the present invention can be applied in image capturing apparatuses such as digital single-lens reflex cameras, network cameras, surveillance cameras, medical cameras, and in-vehicle cameras, communication apparatuses such as smartphones and tablet PCs having camera functions, and information processing apparatuses such as personal computers (PCs) and servers.

The first to eighth embodiments described below are examples of configurations for shortening the processing time required for inferencing processing performed by a restoration processing unit that generates an image quality-restored image, and the ninth to eleventh embodiments are examples of configurations for improving image quality restoration performance in a restoration processing unit that generates an image quality-restored image.

First Embodiment

A first embodiment will be described hereinafter.

Apparatus Configuration

First, the configuration of the signal processing apparatus according to the present embodiment will be described with reference to FIG. 1.

A decoding unit 200 decodes compressed image data and generates a decoded image. The decoded image is assumed to have a lower image quality than the pre-compression original image, due to encoding distortion.

Note that the compressed image data may be a still image or a moving image, and may be in any image format, such as YUV or RAW. However, it is desirable that the coefficient parameters described below be prepared for each image format.

A restoration processing unit 100 performs image restoration processing on the decoded image and generates an image quality-restored image. Note that the image quality-restored image is in the same image format as the decoded image.

The configuration of the restoration processing unit 100 will be described hereinafter.

An image dividing unit 101 scans the decoded image in raster order, divides the image into blocks of a predetermined unit, and generates image blocks in order from the upper-left to the lower-right of the decoded image. The image division by the image dividing unit 101 may be applied to the entire decoded image before the subsequent processing, or the subsequent processing may be performed each time an image block is generated. The present embodiment assumes that the subsequent processing is performed each time an image block is generated, and that the image dividing unit 101 includes a line buffer large enough to generate the block.

Note that in the present embodiment, the division is performed to generate square blocks, and the block size is assumed to be N pixels×N pixels hereinafter for the sake of simplicity.

N is an integer greater than or equal to 1. Although the present embodiment describes using square blocks, the blocks are not limited thereto, and the image may be divided into quadrangular blocks having a shape aside from a square.

It is furthermore assumed that if the decoded image has a resolution that results in fractions at the right and bottom edges in the division, mirroring processing is performed at each edge.

The mirroring processing is processing which generates an image region in which pixels are originally not present by using the pixels up to the edge of the image to add, to the edge of the image, an image mirrored about the edge of the image, and the mirroring processing makes it possible to generate an image block of N pixels×N pixels even at the right and bottom edges.

However, the resolution of the block is not limited thereto, and the image edges can be processed through methods aside from mirroring, such as zero-padding.

An image information determination unit 102 determines image information of each image block generated by the image dividing unit 101, notifies a coefficient parameter determination unit 104 of a result of the determination to a coefficient parameter determination unit 104, and notifies a filter processing unit 105 or an image combining unit 107 of the image block which has undergone the determination. The image information is luminance information, spatial frequency information, or the like of the image block.

The coefficient parameter determination unit 104 has one or more coefficient parameters used in filter processing performed by the filter processing unit 105, selects coefficient parameters on the basis of the determination result notified by the image information determination unit 102, and notifies the filter processing unit 105 of the coefficient parameters.

The filter processing unit 105 performs filter processing that restores image quality using the image block notified by the image information determination unit 102 and the coefficient parameters communicated by the coefficient parameter determination unit 104.

The image combining unit 107 generates an image quality-restored image by combining an image block filtered by the filter processing unit 105 and an unfiltered image block in the same coordinate relationship as the decoded image. An image region produced through the mirroring processing and not needed for the image quality-restored image is discarded by the image combining unit 107.

Note that the present embodiment describes an example of filter processing using deep learning, where the filter processing unit 105 includes a neural network, and the coefficient parameters determined by the coefficient parameter determination unit 104 are coefficient parameters that have been learned in advance through machine learning.

The processing of the filter processing unit 105 corresponds to inferencing processing in the deep learning, and the image quality-restored image is generated in units of image blocks by performing the image restoration processing through the inferencing processing. In the following, the inferencing processing and the image restoration processing will be treated as being equivalent.

Although the neural network mentioned above is assumed to be constituted by a Convolutional Neural Network (CNN) and a fully-connected layer, the neural network is not limited thereto.

Furthermore, the coefficient parameters mentioned above correspond to weights, biases, and so on of edges connecting the nodes in each layer in the fully-connected layer, and the weights, biases, and so on in the kernel of the CNN. In the present embodiment, these parameters are updated through learning in the neural network, and are collectively referred to as "coefficient parameters".

Unit of Obtainment of Coefficient Parameters and Learning Method

A unit of obtainment of coefficient parameters, and a learning method, used in the image restoration processing according to the first embodiment will be described next with reference to FIG. 2.

Machine learning which uses a neural network has been shown to be effective for learning on each of training image sets which have specific features.

Even when image restoration is the target, image restoration performance can be enhanced by performing learning for each of specific image features and then using the pre-learned parameters obtained for each image feature to make inferences.

Because compression involves performing frequency transforms and then performing encoding processing in the frequency domain, the magnitudes of DC and AC components also serve as indicators of degradation trends in the encoded data and can therefore be thought of as important features of an image of interest.

Accordingly, in the present embodiment, a total of four classifications are performed in advance by combining the magnitude of a pixel value average (the DC component) and the magnitude of a variance (the AC component) in an image block of interest, and the learning is performed after sorting the images to be learned into each class.

In the present embodiment, taking the median value of all samples to be learned as a threshold, four classification image sets are used, having separated all the samples into two in terms of the pixel value average and variance.

Note, however, that the method for determining the classes in advance, the number of classes, and so on are not limited. The indicators representing the DC component, the AC component, and so on described in the present embodiment may each be classified into three or more classes, or be classified only by an indicator corresponding to the AC component without being classified by the indicator corresponding to the DC component. In addition, classification may be performed using a third indicator separate from the DC component and the AC component. This includes, for example, classifying blocks having edges and blocks containing a large amount of noise, even in image blocks having a high level of variance.

Figure 3:
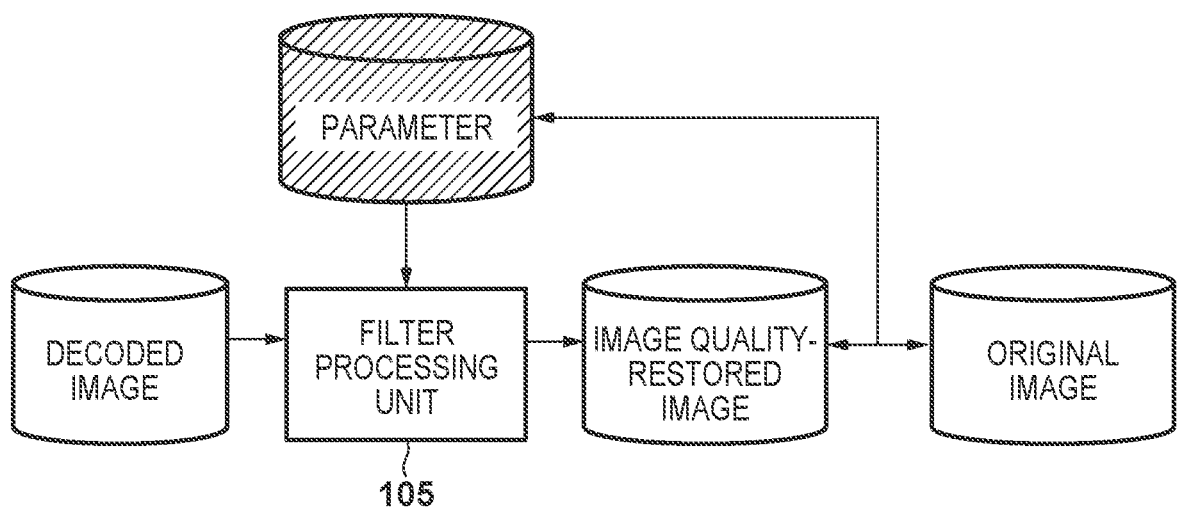
FIG. 3 is a diagram illustrating a learning method of a filter processing unit according to the first embodiment.

FIG. 3 illustrates a learning method of the filter processing unit 105.

In FIG. 3, the filter processing unit 105 used in the learning used for training has the same configuration as in FIG. 1, but the other elements included in the restoration processing unit 100 are not needed for the learning. In other words, the image block division may be performed in advance, and the training image set for obtaining the coefficient parameters may be prepared in advance as well.

Because the decoded image having the highest image quality corresponds to the quality of the original image before encoding, the learning according to the present embodiment repeats processing which feeds back to the coefficient parameters so that the image output by the neural network approaches the original image.

The present embodiment assumes that a gradient, which is an amount of change in the coefficient parameter, is obtained through error back propagation, and the coefficient parameter is updated using stochastic gradient descent as the method for optimizing the parameter.

Although the method of updating the coefficient parameters is one way through which the neural network learns, other methods may be used to obtain the gradient, optimize the parameters, and so on.

Although the present embodiment assumes that the mean squared error (mse) of the original image and the neural network output image is used as an indicator of the image quality, the indicator need not be limited to the mse, and any indicator which indicates the image quality may be used.

As described above, class indicators are determined for the image blocks, learning is performed on a class-by-class basis, and coefficient parameters used in inference by the neural network are obtained for each class.

Subject of Inference

Human visual characteristics make it difficult to see a drop in the image quality of complex images having high spatial frequencies. Furthermore, considering an image having image features in which there is a low pixel value average and a low luminance and an image having image features in which there is a high pixel value average and a high luminance, when subjectively comparing an original image with a decoded image, it is difficult to recognize degradation in the image which has the relatively higher pixel value average and which is brighter if the difference between the average pixel values of the original image and the decoded image is the same.

In view of the human visual characteristics described above, restoring the image quality of image blocks with high pixel value averages and variances is considered to be of low priority. Accordingly, the load of the inferencing processing is reduced by not performing inference on image blocks having high pixel value averages and variances. The processing will be described in detail later with reference to FIG. 4.

Processing by Restoration Processing Unit 100

Processing performed by the restoration processing unit 100 will be described next with reference to the flowchart in FIG. 4.

Figure 4:
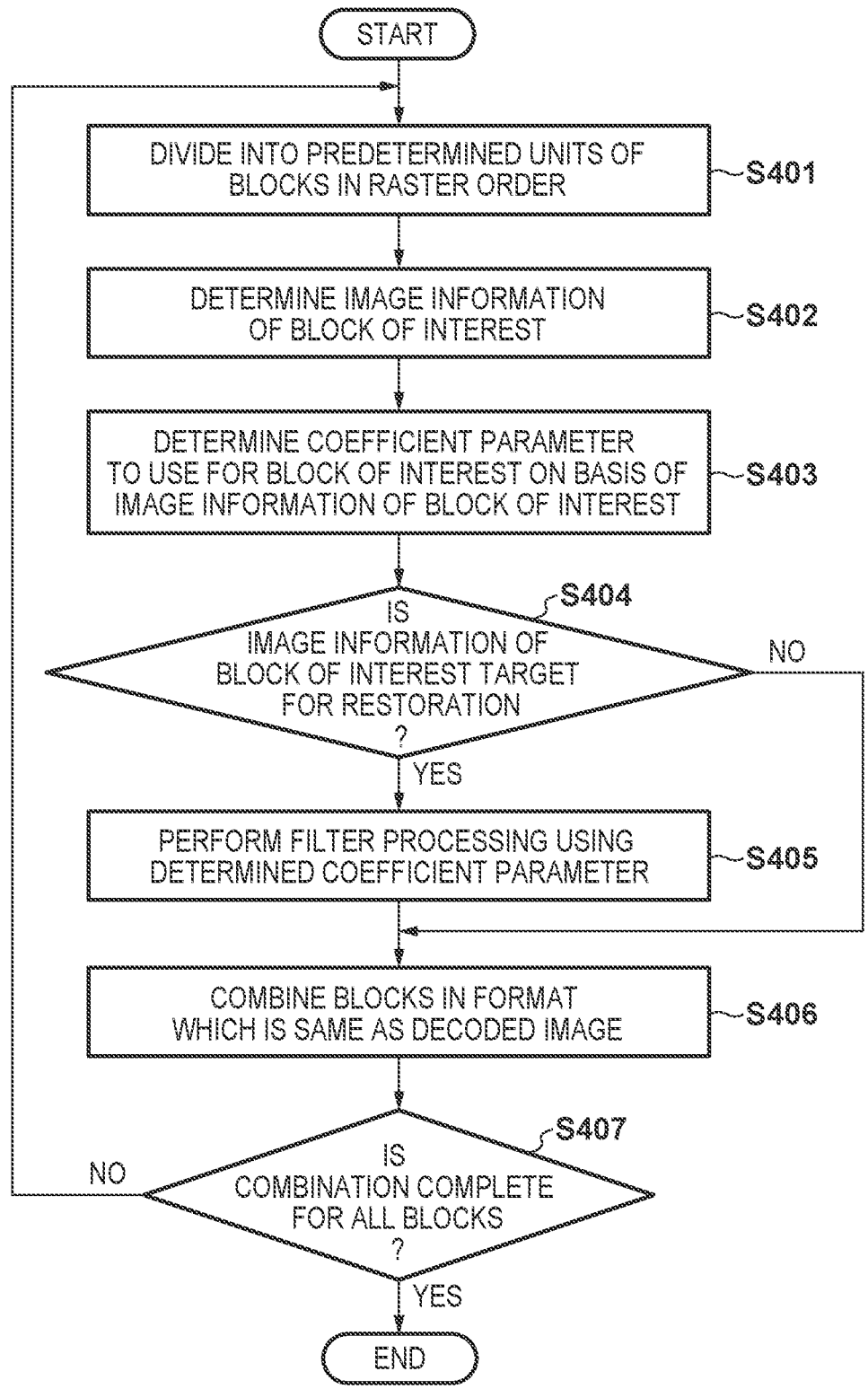
FIG. 4 is a flowchart illustrating processing performed by a restoration processing unit according to the first embodiment.

Note that the processing in FIG. 4 is realized by the various units of the restoration processing unit 100 operating in accordance with a predetermined control program.

In step S401, the image dividing unit 101 divides the decoded image into predetermined units of blocks in raster order. Note that the scanning in this image division need not be performed in raster order.

In step S402, the image information determination unit 102 determines image information of a block of interest. In the present embodiment, the pixel value average and variance of the block of interest is calculated, and which of four classes the block of interest belongs to is determined.

In step S403, the coefficient parameter determination unit 104 determines the coefficient parameter to use for the block of interest on the basis of the image information of the block of interest (luminance information, spatial frequency information, and the like) which is the result of the classification by the image information determination unit 102.

In step S404, if the image information determination unit 102 has determined that the image information of the block of interest is a target for restoration, the sequence moves to step S405, and if not, the sequence moves to step S406. In the present embodiment, "target for restoration" refers to three classes, namely, {low pixel value average, low variance}, {high pixel value average, low variance}, and {low pixel value average, high variance}. Although the present embodiment will describe these three classes as being the targets for restoration, the number of classes which are targets for restoration is not limited, and may be one or two instead.

In step S405, the filter processing unit 105 performs filtering processing on the image block which is the target for restoration, using the coefficient parameter determined by the coefficient parameter determination unit 104. The targets for restoration on which the filtering processing is performed are the three classes mentioned above, and the processing of step S405 is not performed on image blocks having {high pixel value average, high variance}.

In step S406, the image combining unit 107 combines the blocks of interest in a format which is the same as the decoded image. Because the processing is performed in raster order, it is sufficient to perform the image combination in the same order as that used in the image division. Note that the actual image combination operation is a simple operation in which the blocks of interest are repeatedly written to memory (not shown) so as to align the decoded image with the coordinate positions, and with the exception of the time required for communication with the memory, the processing time is negligible with respect to other processing.

In step S407, if the image combining unit 107 determines that the combination is complete for all the blocks of interest, the processing ends, but if it is determined that the combination is incomplete, the sequence returns to step S402 and the series of processes continues.

According to the processing illustrated in FIG. 4, it is possible to avoid performing the restoration processing on blocks having image features which are not important in terms of subjective image quality but perform the restoration processing on blocks having image features which are important in terms of subjective image quality, and thus the image restoration processing can be implemented in a short processing time.

As described above, by skipping the inferencing processing for specific image blocks, restoration processing which efficiently restores subjective image quality can be performed.

Second Embodiment

A second embodiment will be described hereinafter.

Figure 5:
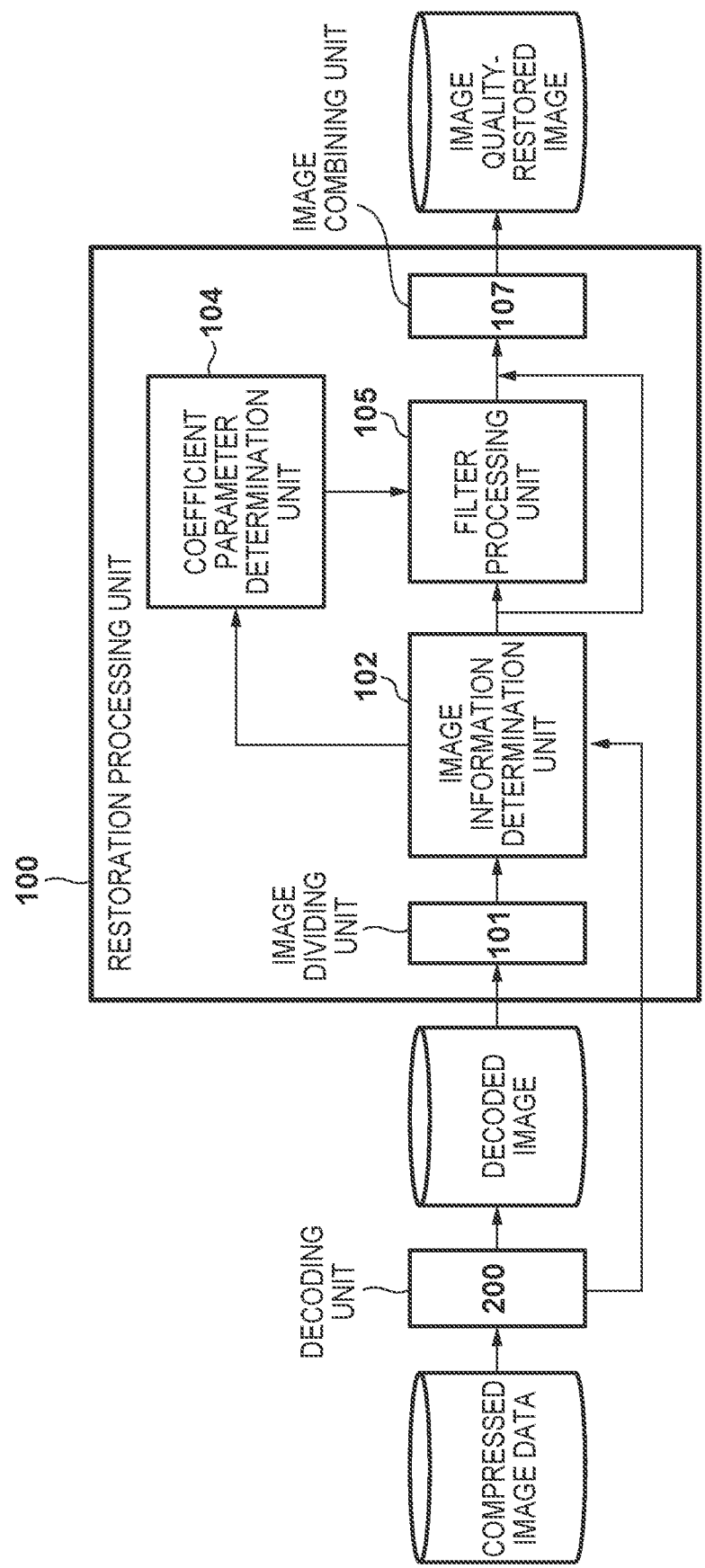
FIG. 5 is a block diagram illustrating an example of a configuration of a signal processing apparatus according to a second embodiment.

FIG. 5 is a block diagram illustrating the configuration of a signal processing apparatus according to the second embodiment. Although the configuration is similar to that illustrated in FIG. 1, a path for notifying the image information determination unit 102 of decoded image information from the decoding unit 200 is provided.

Quantization processing is performed in lossy compression, and when decoding lossy compressed image data, the image is restored by performing inverse quantization using quantization information accompanying the lossy compressed image data.

Note that the "quantization value" is a parameter in which as the value increases, more quantization error occurs, and the image quality of the decoded image drops.

Figure 6:
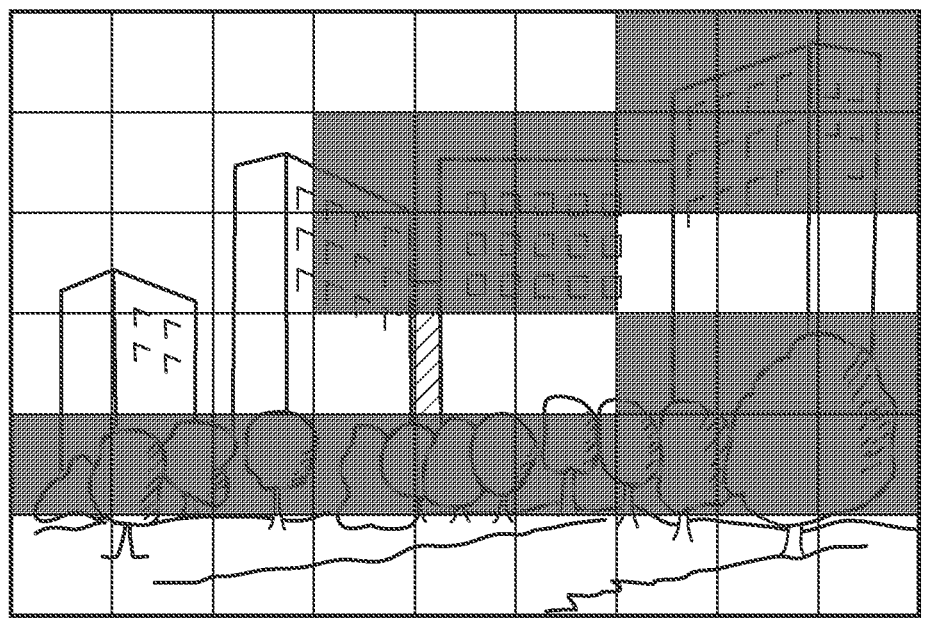
FIG. 6 is a diagram depicting adaptive quantization according to the second embodiment.

Additionally, in encoding processing, adaptive quantization processing is performed to determine the quantization value for each image block. FIG. 6 illustrates adaptive quantization. In FIG. 6, image blocks which are filled with gray represent blocks with a relatively high level of quantization, and other blocks represent blocks with a relatively low level of quantization.

As illustrated in FIG. 6, adaptive quantization is processing which increases the subjective image quality by changing the magnitude of the quantization value for each image block.

The present embodiment assumes that adaptive quantization is performed using a quantization value for blocks having image features of {high pixel value average, high variance} and using a low quantization value for blocks having other image features. The adaptive quantization method is not limited thereto, however, and may be configured from three or more quantization values.

In the present embodiment, for image blocks having high quantization values, the image information determination unit 102 notifies the filter processing unit 105 of those blocks; for other image blocks, the image information determination unit 102 notifies the image combining unit 107 of those image blocks without notifying the filter processing unit 105.

In this manner, in the present embodiment, the image information determination unit 102 receives the above-described quantization information, and the inferencing processing is not performed for image blocks which have low quantization values and which will therefore have good image quality when decoded. This is based on the fact that the image quality is better when the quantization value is low.

As described above, according to the second embodiment, by skipping the inferencing processing for specific image blocks, restoration processing which efficiently restores subjective image quality can be performed.

Third Embodiment

A third embodiment will be described hereinafter.

Figure 7:
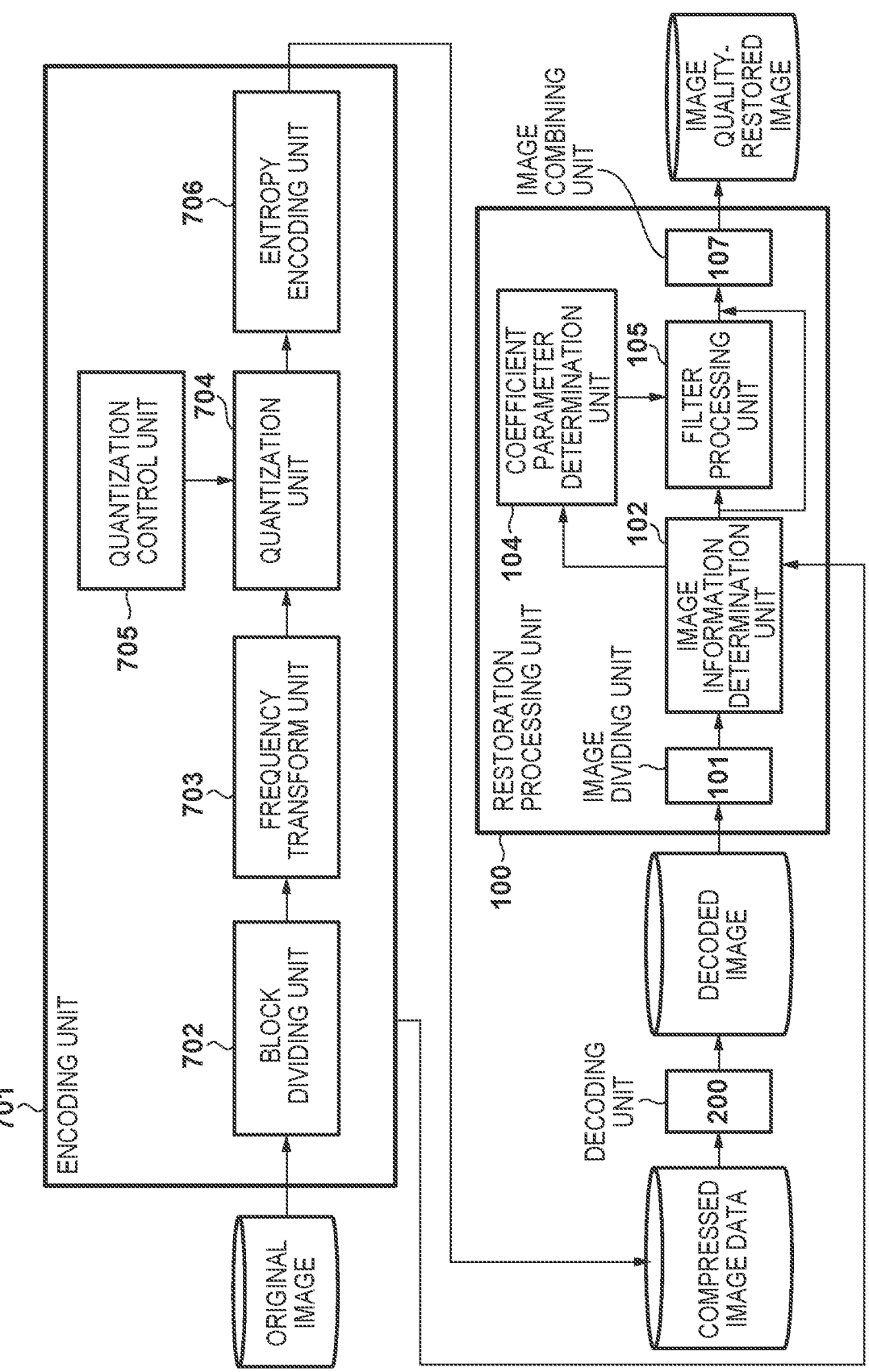
FIG. 7 is a block diagram illustrating an example of a configuration of a signal processing apparatus according to a third embodiment.

FIG. 7 illustrates an example of the configuration of a signal processing apparatus according to the third embodiment. In addition to the configuration illustrated in FIG. 1, the signal processing apparatus illustrated in FIG. 7 further includes an encoding unit 701 which encodes an original image and generates encoded data, and compressed image data is obtained from the encoding. Elements which are the same as those in FIG. 1 are given like reference signs.

The configuration of the encoding unit 701 will be described hereinafter.

A block dividing unit 702 divides the original image, which is the target of encoding, into blocks. The block dividing unit 702 scans the decoded image in raster order, divides the image into blocks of a predetermined unit, and generates image blocks in order from the upper-left to the lower-right of the decoded image. Note that the subsequent processing may be performed after first applying the image division to the entire original image, or the subsequent processing may be performed each time an image block is generated. The present embodiment assumes that the subsequent processing is performed each time an image block is generated, and that the block dividing unit 702 includes a line buffer large enough to generate the block.

The present embodiment assumes that the image is divided into N×N image blocks. Note that the image block size may be variable at each coordinate.

A frequency transform unit 703 performs a discrete cosine transform (DCT) on each of the stated image blocks and obtains a coefficient block. Note that the frequency transform is not limited to a DCT.

A quantization unit 704 performs quantization on each coefficient block obtained through the frequency transform.

A quantization control unit 705 determines, for each coefficient block, quantization parameters to be used for the quantization performed by the quantization unit 704.

Note that each coefficient block is transformed by the DCT into frequency coefficients from DC to AC components, and the quantization unit 704 performs the quantization using quantization values which correspond to each of the DC and AC components and which are uniquely determined on the basis of the quantization parameters determined by the quantization control unit 705.

An entropy encoding unit 706 entropy-encodes the quantized coefficients for each quantized block and generates compressed image data.

Note that the configuration of the encoding unit 701 is not limited to this configuration, and may be configured to support moving image compression standards such as High Efficiency Video Coding (HEVC).

The encoding unit 701 notifies the image information determination unit 102 of the restoration processing unit 100 of encoding information.

In the present embodiment, image information for determining whether or not to perform inferencing processing, determined by the image information determination unit 102, is obtained from the encoding unit 701.

A method which increases the encoding efficiency through frequency transforms using the frequency transform unit 703, adaptive quantization techniques using the quantization unit 704 and the quantization control unit 705, or the like is used for the encoding processing performed by the encoding unit 701.

Information pertaining to a DC component and an AC component was determined by the image information determination unit 102 in the first embodiment, but in the present embodiment, information pertaining to the DC component and the AC component obtained through the encoding processing is received and used by the image information determination unit 102 as well.

In the present embodiment, to perform the adaptive quantization using the encoding unit 701 and the quantization control unit 705, the pixel value average and variance are obtained for each image block, the quantization value is determined for each image block, and the image information determination unit 102 is notified of the quantization value obtained for each image block.

As in the first embodiment, when the image block of interest is of {high pixel value average, high variance}, the image information determination unit 102 notified the image combining unit 107 of the image block to the image combining unit 107, without going through the filter processing unit 105, so that the inference is not performed.

According to this method, the notified image information is only matched with the coordinates in the image of interest by using the pixel value average and variance obtained from the encoding unit 701 side, and thus the restoration processing unit 100 does not perform any processing for calculating image information.

It is therefore possible to determine whether or not to perform the inferencing processing with a shorter processing time.

As described above, according to the third embodiment, by skipping the inferencing processing for specific image blocks and further reducing the image information determination processing, restoration processing which efficiently restores subjective image quality can be performed while shortening the time of the processing performed by the restoration processing unit 100.

Note that the quantization value determined by the quantization control unit 705 may be communicated to the image information determination unit 102 as-is, and whether or not to perform the inferencing processing may be determined on the basis of the quantization value in the same manner as in the second embodiment.

Fourth Embodiment

A fourth embodiment will be described hereinafter.

Figure 8:
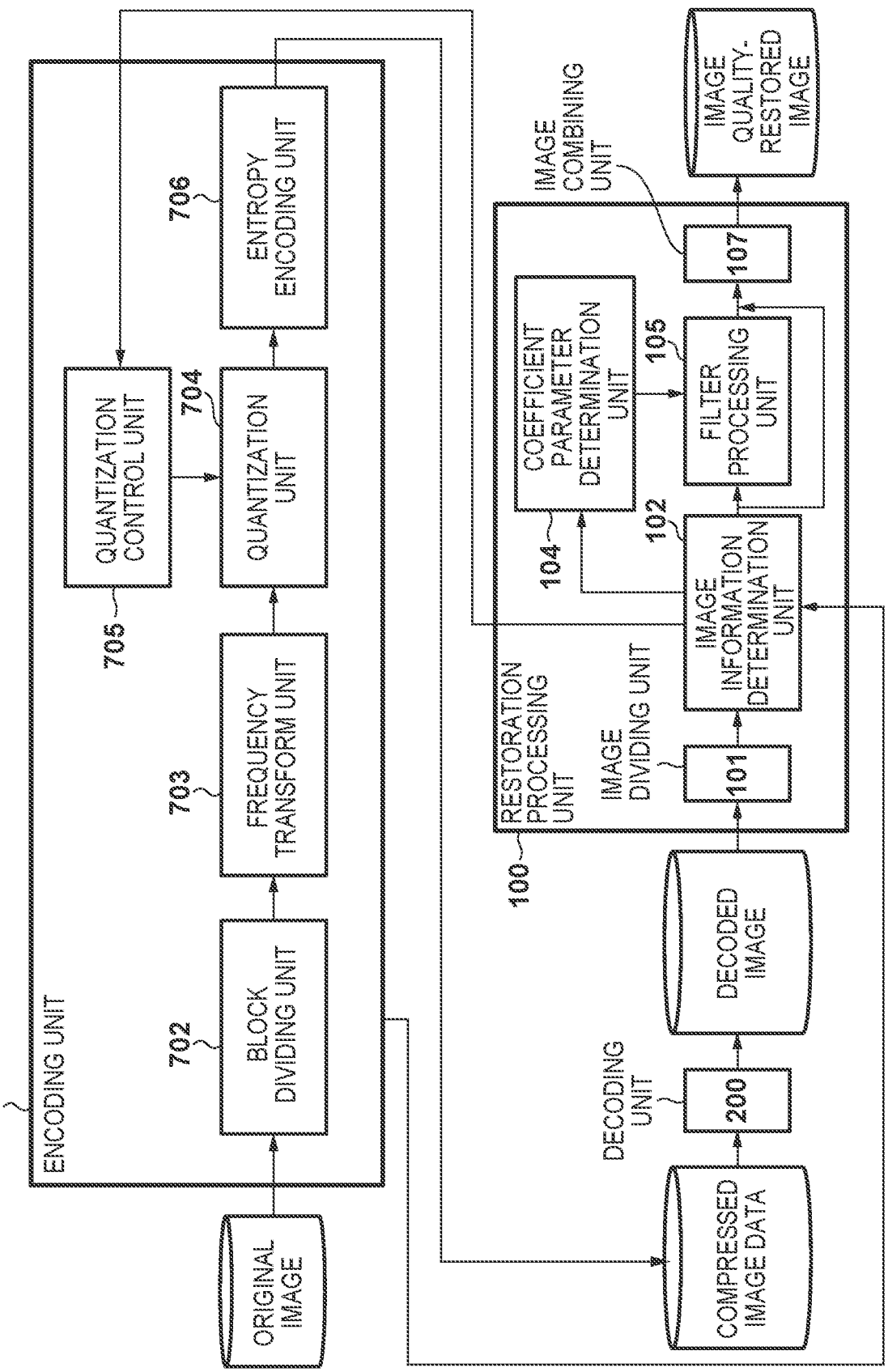
FIG. 8 is a block diagram illustrating an example of a configuration of a signal processing apparatus according to a fourth embodiment.

FIG. 8 illustrates an example of the configuration of a signal processing apparatus according to the fourth embodiment. The fourth embodiment differs from the third embodiment in that the quantization control unit 705 is notified of an image determination condition indicating whether or not to perform the inferencing processing from the image information determination unit 102 of the restoration processing unit 100.

The first to third embodiments described examples pertaining to image restoration processing on a decoded image decoded after compression based on quantization determined by the encoding unit 701 alone. As opposed to this, the present embodiment will describe an example of quantization control under the assumption that restoration processing is performed.

Note that the present embodiment assumes that, on the basis of the concept described above, the filtering processing is not performed on image blocks having features of {low pixel value average, low variance} as an image in which a drop in image quality is easily visible.

Furthermore, by notifying the quantization control unit 705 of the encoding unit 701 of image information that the restoration processing will not be performed in advance, the quantization control unit 705 can recognize on which image information the restoration processing is not to be performed.

Because blocks having image features of {low pixel value average, low variance} are not to be restored, the quantization control unit 705 determines a quantization value which satisfies a predetermined subjective image quality.

The determined quantization value may be a lossless-equivalent quantization value at which no drop in image quality occurs.

By performing the foregoing and skipping the inferencing processing for specific image blocks, restoration processing which efficiently restores subjective image quality can be performed while shortening the time of the processing performed by the restoration processing unit 100.

Note that the data size of the compressed image data will increase if the quantization value is reduced for some of the image blocks.

Accordingly, in a system which suppresses the data size of the compressed image data to less than or equal to a predetermined size, a method which increases the quantization value for image blocks aside from blocks having the image feature of {low pixel value average, low variance} is one solution for suppressing the data size.

Although doing so does increase the quantization value of blocks having predetermined image features, the image is expected to be restored later through the filtering processing, and thus the image quality of the image as a whole can be restored.

Fifth Embodiment

A fifth embodiment will be described hereinafter.

The configuration of a signal processing apparatus according to the fifth embodiment is the same as in FIG. 8.

The difference from the fourth embodiment is that in the fifth embodiment, the division size for the block division is variable. Note that the blocks having image features for which inference is not performed are, as in the fourth embodiment, {low pixel value average, low variance} image blocks.

Figure 9:
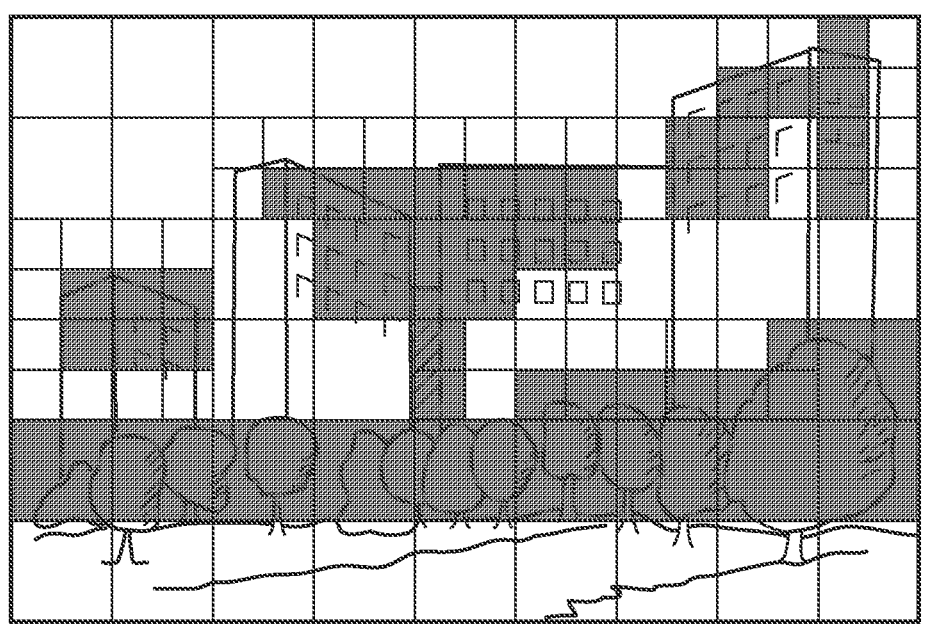
FIG. 9 is a diagram depicting adaptive quantization according to a fifth embodiment.

FIG. 9 illustrates adaptive quantization according to the present embodiment, and illustrates an example in which the image can be further divided even at an image size that is half the image block size used in FIG. 6 in the vertical and horizontal directions. Doing so enables more detailed classifications to be made, which improves the accuracy with which the image information determination unit 102 determines the image information and makes it possible to further increase the image quality restoration performance. In areas of low quantization, a quantization value that satisfies a predetermined subjective image quality may be used, as in the fourth embodiment.

Figure 10:
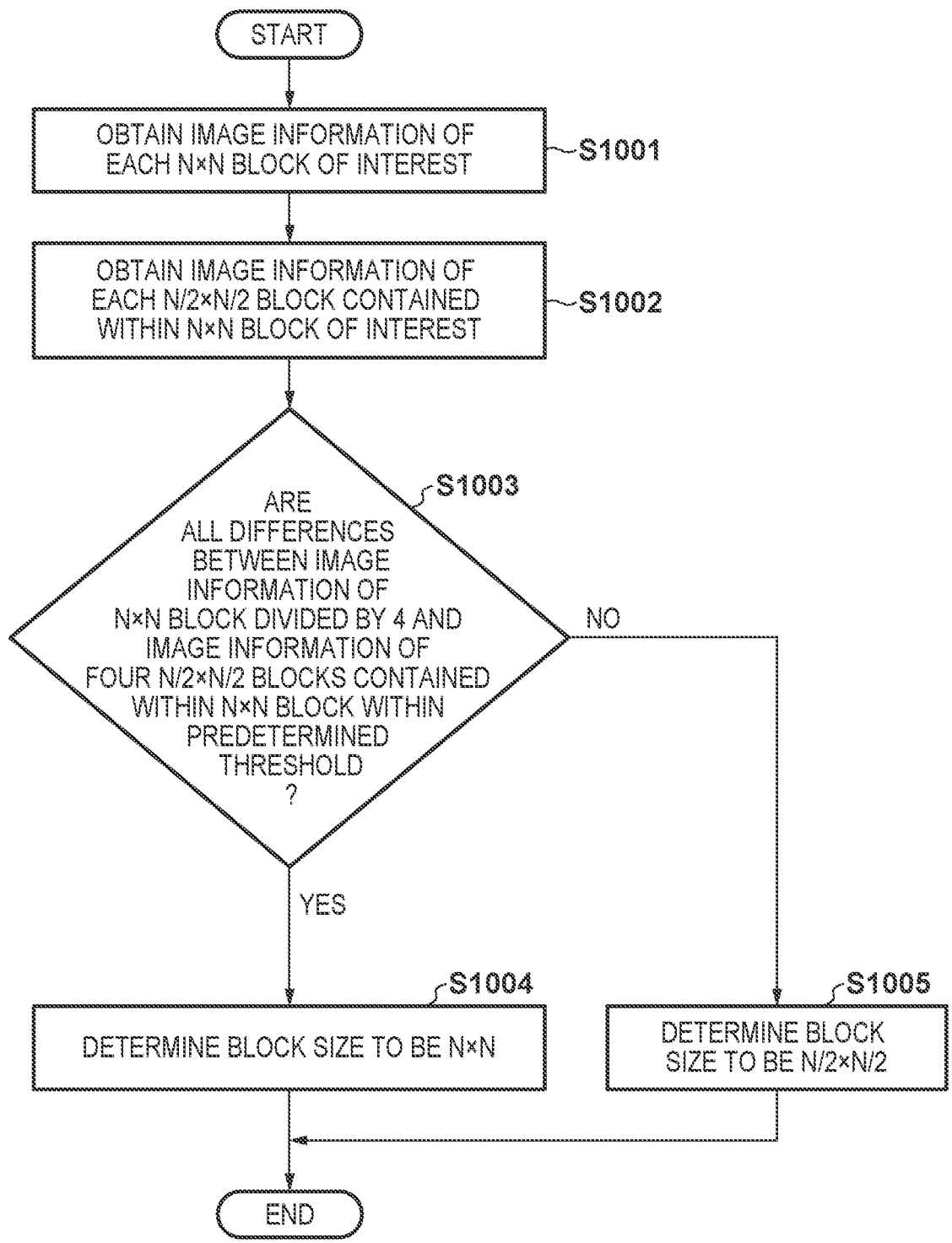
FIG. 10 is a flowchart illustrating processing performed by a block division unit according to the fifth embodiment.

FIG. 10 illustrates block division processing according to the present embodiment. In the present embodiment, two block sizes can be selected, namely an N×N image block and an N/2×N/2 image block. FIG. 10 is a flowchart illustrating whether an image will be divided into N×N image blocks or N/2×N/2 image blocks when N undivided lines are buffered in a line buffer.

Processing performed by the block dividing unit 702 according to the present embodiment will be described hereinafter with reference to the flowchart in FIG. 10.

In step S1001, the block dividing unit 702 obtains the image information of an N×N image block of interest. In the present embodiment, the image information is the pixel value average and variance.

In step S1002, the block dividing unit 702 obtains the image information of each N/2×N/2 image block contained within the N×N image block of interest.

In step S1003, if a difference between the image information of the N×N block divided by 4 and the image information of the four N/2×N/2 image blocks contained within the N×N image block is within a predetermined threshold for all four N/2×N/2 image blocks, the block dividing unit 702 advances the sequence to step S1004, and if not, to step S1005.

In the present embodiment, the comparisons are made using both a threshold pertaining to the pixel value average and a threshold pertaining to variance, and if the difference is greater than the threshold for even one of the pixel value average and the variance, it is determined that there is a difference which is greater than or equal to the predetermined threshold.

In step S1004, the block dividing unit 702 determines the block size to be N×N.

In step S1005, the block dividing unit 702 determines the block size to be N/2×N/2.

According to the processing illustrated in FIG. 10, if the image features which can be obtained for image features obtained at the original image size (N×N) do not change even when the image block size is reduced, it can be detected that there is no need to perform the subsequent encoding processing and image restoration processing at a smaller division size.

This makes it possible to more accurately determine an image region on which to perform inference while reducing the overhead of the processing for subdividing the blocks.

As described above, according to the fifth embodiment, making the size of the image blocks, which are the units used for determining the quantization parameters during encoding, variable, increases the restoration efficiency, and by skipping the inferencing processing for specific image blocks, restoration processing which efficiently restores subjective image quality can be performed while shortening the time of the processing performed by the restoration processing unit 100.

Note that the image division size may or may not be square, and three or more block sizes may be intermixed.

Note also that the division size determined by the block dividing unit 702 of the encoding unit 701 and the division size determined by the image dividing unit 101 of the restoration processing unit 100 for the same pixel position may or may not be the same size.

The smaller the size of an image block in the restoration processing unit 100 is, the longer the inferencing processing takes, and thus even if, for example, the image is divided in units of N/2×N/2 pixels during the encoding processing, the image information may be determined for the N×N image block containing four blocks of N/2×N/2 pixels, and it may then be determined whether or not to perform the inference for each N×N image block.

Additionally, the image information determination unit 102 may obtain the image information in units of N/2×N/2 image blocks, the average value of the image information for the four N/2×N/2 image blocks may be taken as the image information of an N×N image block, and the filter processing may then be performed using the N×N image block.

Sixth Embodiment

A sixth embodiment will be described hereinafter.

The configuration of a signal processing apparatus according to the sixth embodiment is the same as in FIG. 8.

The difference from the fourth embodiment is that in the sixth embodiment, the subject on which the inference is not performed is determined on the basis of a result of learning coefficient parameters.

Figure 11:
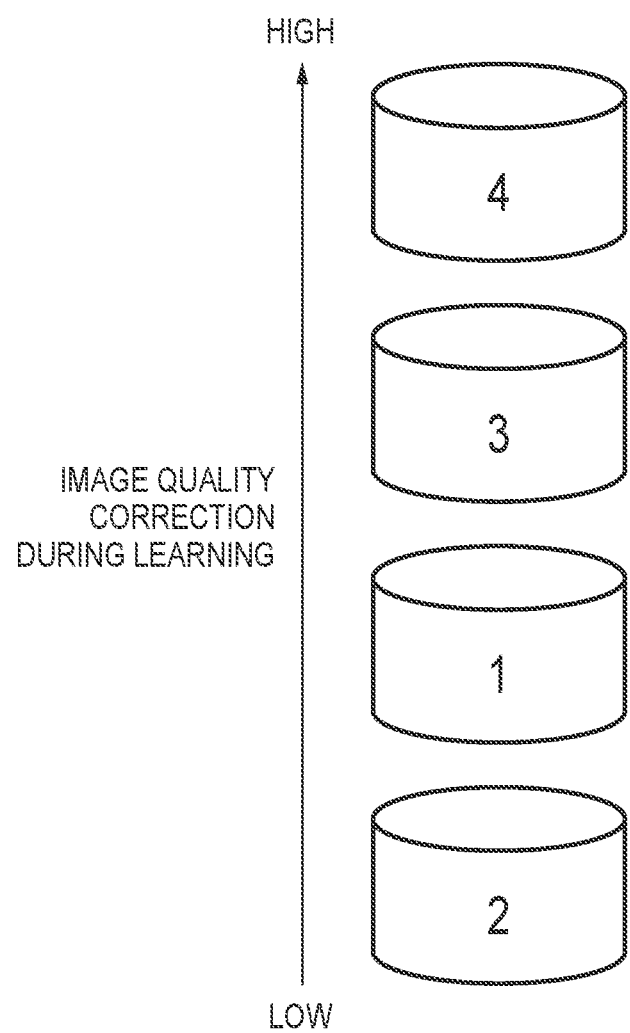
FIG. 11 is a diagram illustrating an order of image quality restoration amounts for each of parameters, according to a sixth embodiment.

FIG. 11 illustrates an order of image quality restoration amounts on a parameter-by-parameter basis.

Figure 2:
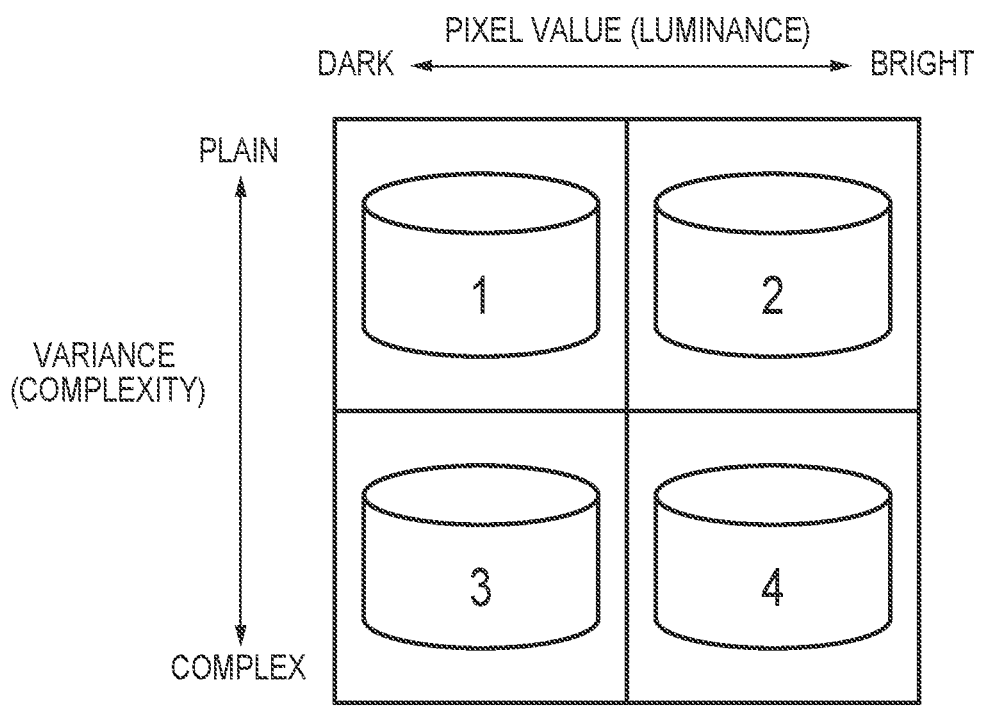
FIG. 2 is a diagram illustrating a unit of obtainment of coefficient parameters, and a learning method, used in image restoration processing according to the first embodiment.

In the present embodiment, the learning illustrated in FIG. 3 is executed for each of the image sets following the classification by pixel value average and variance indicated in FIG. 2. FIG. 11 illustrates an example of the ranking of restoration performance as a learning result for each class obtained through this learning. Here, the restoration performance is an amount of decrease in the mse of the restored image relative to the decoded image.

For the coefficient parameters used in the image restoration, it is desirable that good coefficient parameters be learned for each image subject to restoration, whether that image is a YUV image, an RGB image, or an 8-bit or 10-bit image.

Additionally, because different conditions for images to be restored require learning under each of those conditions, it is not possible to know which image class is easier to restore after classification until the learning has already been performed.

Accordingly, the image features with the lowest restoration performance in the post-classification learning results in the present embodiment have poor restoration efficiency and are therefore not subjected to the restoration processing. In the present embodiment, based on FIGS. 11 and 2, the blocks are classified into {high pixel value average, low variance} image features.

However, without performing the restoration processing, there is no expectation that the subjective image quality will improve. Thus as described in the fourth embodiment, the quantization control unit 705 is notified of the image features for which the restoration processing is not to be performed, and the quantization control unit 705 sets the quantization value to a lower value for blocks having the {high pixel value average, low variance} image features.

As described above, according to the sixth embodiment, using the learning results, the inference is performed only for blocks having image features with a high restoration efficiency, and the inferencing processing for specific image blocks is skipped, which makes it possible to perform restoration processing which efficiently restores subjective image quality while shortening the time of the processing performed by the restoration processing unit 100.

Seventh Embodiment

A seventh embodiment will be described hereinafter.

Figure 12:
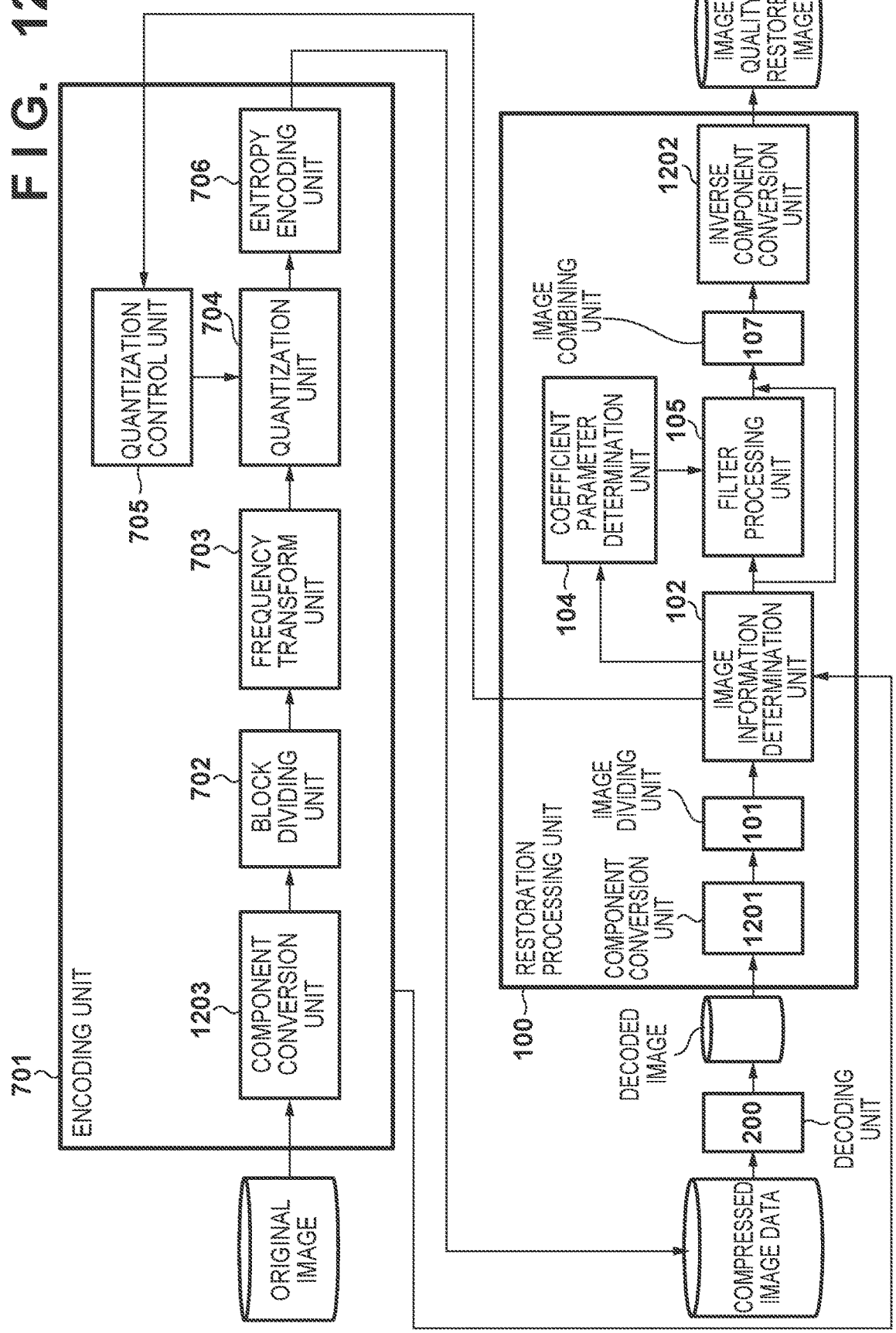
FIG. 12 is a block diagram illustrating an example of a configuration of a signal processing apparatus according to a seventh embodiment.

FIG. 12 illustrates an example of the configuration of a signal processing apparatus according to the seventh embodiment. In the seventh embodiment, inferencing processing is performed for each of components in an image.

In FIG. 12, component conversion units 1201 and 1203 separate a decoded image into a luminance Y and color differences U and V. The image dividing unit 101 divides an image on a component-by-component basis. The coefficient parameter determination unit 104 holds coefficient parameters that have been learned in advance for each component. An inverse component conversion unit 1202 further integrates the components, which have been combined by the image combining unit 107, and generates an image restoration image.

In encoding processing, quantization control and other processing are often performed on a component-by-component basis, and of the YUV components, Y is known to be the dominant component for subjective image quality. Accordingly, in the case of the Y component, the image information determination unit 102 determines not to perform the filtering processing, and notifies the quantization control unit 705 that the component on which the filtering processing will not be performed is the Y component. The quantization control unit 705 sets the quantization value of the Y component to a quantization value that enables sufficient image quality to be achieved even without the restoration processing being performed.

As described above, according to the seventh embodiment, by skipping the inferencing processing for a specific component and reducing the quantization value of the component for which the inferencing processing is skipped, restoration processing which efficiently restores subjective image quality can be performed while shortening the time of the processing performed by the restoration processing unit 100.

Note that the component conversion need not be YUV conversion, and may instead be conversion of color components constituted by red, green, and blue, or conversion into four or more other components.

When converting color components constituted by red, green, and blue, subjective degradation is easily visible for the G component due to its dominant luminance and the visual characteristics of humans, and thus a method in which the quantization value of the G component is reduced and the restoration processing is not performed on the G component is effective.

Additionally, although the present embodiment has a configuration in which the component conversion unit 1201 is included in the restoration processing unit 100, if the processing is based on encoding that performs component conversion processing during the encoding, component data may be included as intermediate information of the decoding unit 200. Accordingly, the configuration may use a combined processing unit which performs decoding and restoration processing, with the decoded image not being generated by the decoding unit 200, and the image dividing unit 101 is directly notified of the component data, which is intermediate data of the decoding unit 200.

Eighth Embodiment

An eighth embodiment will be described hereinafter.

Figure 13:
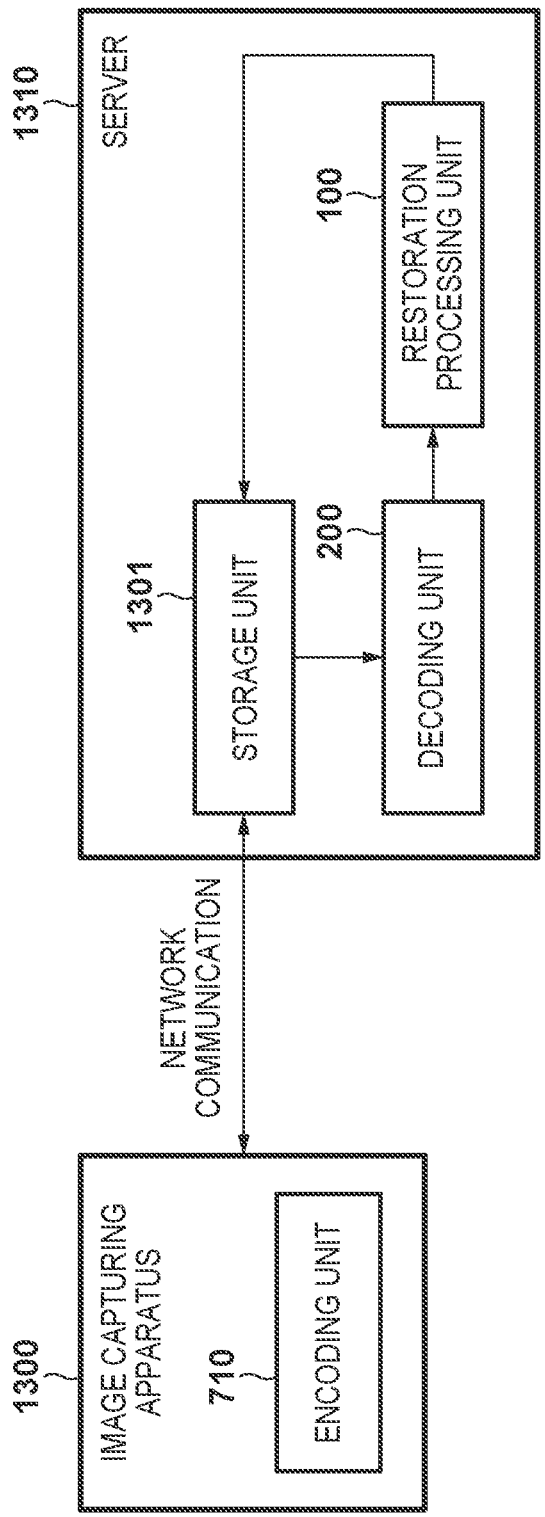
FIG. 13 is a block diagram illustrating an example of a system configuration according to an eighth embodiment.

FIG. 13 illustrates an example of the configuration of a signal processing system in which an image capturing apparatus and a server are communicably connected, according to the eighth embodiment. As illustrated in FIG. 13, in the present embodiment, the encoding unit 701 is provided in an image capturing apparatus 1300. Meanwhile, the decoding unit 200 and the restoration processing unit 100 are provided in a server 1310.

The server 1310 also includes a storage unit 1301 constituted by a storage device. The image capturing apparatus 1300 is configured to be capable of connecting to the server 1310 over a network.

In the present embodiment, the configuration is such that an image captured by the image capturing apparatus 1300 is encoded by the encoding unit 701, and the resulting compressed image data can be transmitted to the server 1310 through network communication and stored in the storage unit 1301. A user who wishes to display or output a captured image can obtain the image by having the server 1310 perform decoding and restoration processing on the compressed image data, which is captured image data on the server.

Furthermore, the image capturing apparatus 1300 and the server 1310 can notify of information aside from images with each other.

Using the fact that information can be exchanged through network communication, the notification of image information from the encoding unit 701 to the restoration processing unit 100 which has already been described can be performed by sending an image information file from the image capturing apparatus 1300 to the server 1310.

Likewise, according to the present embodiment, the notification of image information for determining whether or not to perform the inferencing processing from the restoration processing unit 100 to the encoding unit 701 can be performed by sending an image information file from the server 1310 to the image capturing apparatus 1300.

Additionally, the image information notified from the encoding unit 701 may be sent to the server 1310 after being collected into a single container as metadata of the compressed image data.

As described above, according to the eighth embodiment, even if the encoding unit 701 and the restoration processing unit 100 are separate devices, the inferencing processing for specific image blocks can be skipped, and restoration processing which efficiently restores subjective image quality can be performed while shortening the time of the processing performed by the restoration processing unit 100.

Although the present embodiment describes an example in which the decoding unit 200 and the restoration processing unit 100 are provided in the same server 1310, the configuration is not limited thereto. As long as the devices can communicate with each other, a configuration in which the decoding unit 200 is provided in the image capturing apparatus 1300 and the decoding is performed by the image capturing apparatus 1300, a configuration in which the encoding unit 701, the decoding unit 200, and the restoration processing unit 100 are all provided in different devices, and so on are possible as well. Additionally, although the present embodiment describes communication between the image capturing apparatus 1300 and the server 1310 as an example, the configuration may be such that the encoding unit 701, the decoding unit 200, and the restoration processing unit 100 are provided within other devices, as long as the devices have communication functionality.

Ninth Embodiment

A ninth embodiment will be described hereinafter.

The configuration of a signal processing apparatus according to the ninth embodiment will be described with reference to FIG. 14.

Figure 14:
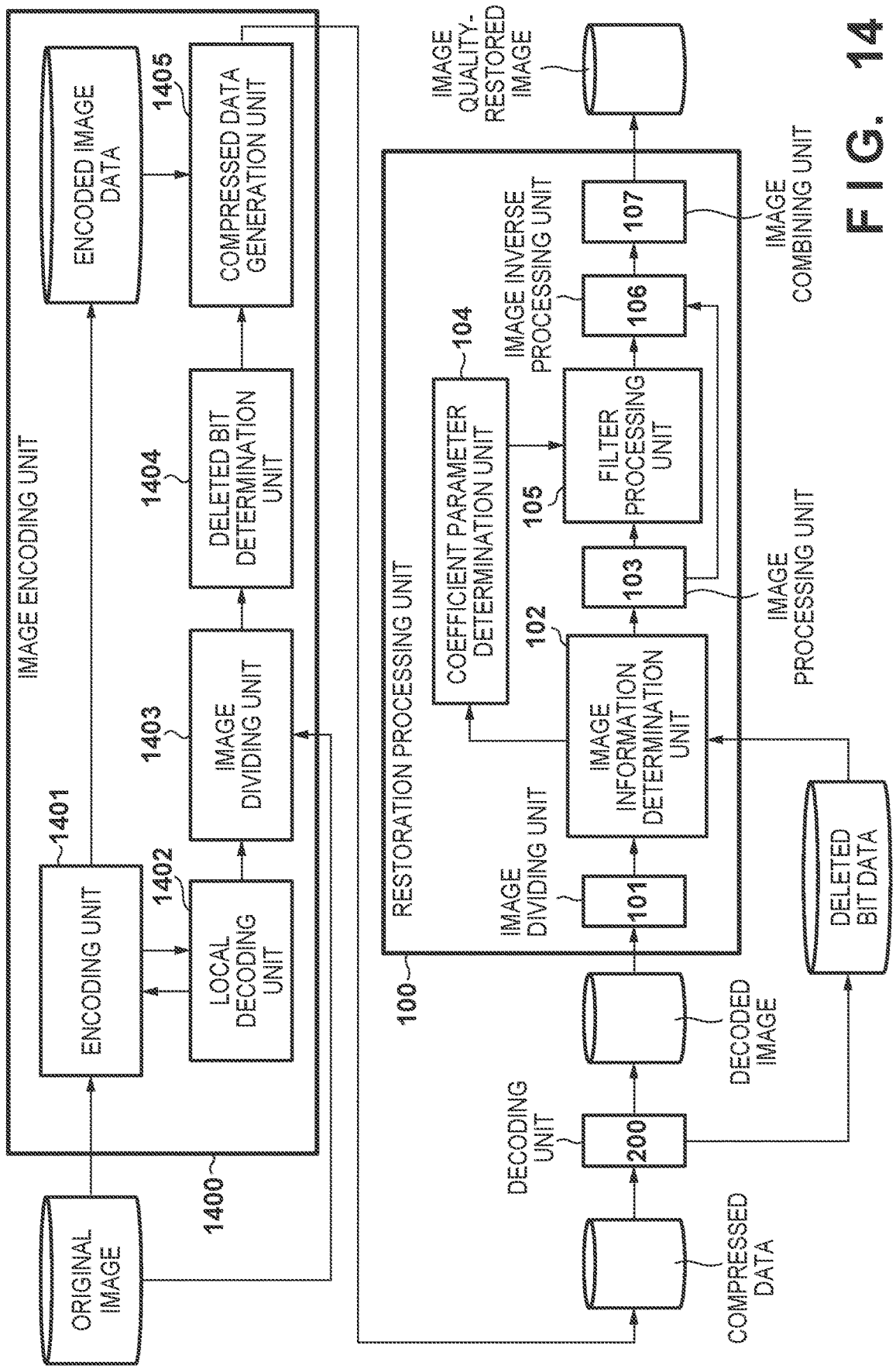
FIG. 14 is a block diagram illustrating an example of a configuration of a signal processing apparatus according to a ninth embodiment.

FIG. 14 illustrates an example of the configuration of the signal processing apparatus according to the ninth embodiment.

The signal processing apparatus according to the present embodiment includes the restoration processing unit 100, the decoding unit 200, and an image encoding unit 1400.

The image encoding unit 1400 encodes an original image and generates compressed image data.

Note that the original image may be in any format, such as a still image, a moving image, a YUV image, a RAW image, or the like. However, it is desirable that the coefficient parameters described below be prepared for each image format. The present embodiment assumes that the original image is a monochromatic image with a bit depth of 8 bits.

The configuration of the image encoding unit 1400 will be described hereinafter.

An encoding unit 1401 performs compression encoding on the original image and generates encoded image data.

A local decoding unit 1402 performs local decoding on the encoded image data and generates a locally-decoded image.

In the present embodiment, a configuration in which the encoding unit 1401 encodes a difference between the original image and the locally-decoded image is employed, and thus the configuration is such that the encoding unit 1401 is notified of the locally-decoded image. However, the configuration is not limited thereto.

An image dividing unit 1403 divides the original image and the locally-decoded image into blocks. The image dividing unit 1403 scans the locally-decoded image and the original image in raster order, divides the images into blocks of a predetermined unit, and generates locally-decoded image blocks and original image blocks in order from the upper-left to the lower-right of the images. Note that the locally-decoded image and the original image have the same image resolution, and thus sets constituted by a locally-decoded block and an original image block located at the same pixel position are generated. The image division by the image dividing unit 1403 may be applied to the entire locally-decoded image and original image before the subsequent processing, or the subsequent processing may be performed each time an image block is generated. The present embodiment assumes that the subsequent processing is performed each time an image block is generated, and that the image dividing unit 1403 includes a line buffer large enough to generate the block.

Note that in the present embodiment, the division is performed to generate square blocks, and the block size is assumed to be N pixels×N pixels hereinafter for the sake of simplicity. Note that the image block size may be variable at each coordinate.

N is an integer greater than or equal to 1. Although the present embodiment describes using square blocks, the blocks are not limited thereto, and the image may be divided into quadrangular blocks having a shape aside from a square.

It is furthermore assumed that if the decoded image has a resolution that results in fractions at the right and bottom edges in the division, mirroring processing is performed at each edge.

However, the resolution of the block is not limited thereto, and the image edges can be processed through methods aside from mirroring, such as zero-padding.

A deleted bit determination unit 1404 compares the original image block and the locally-decoded block at the same pixel position, and determines a deleted bit. "Deleted bit" refers to a pixel bit which is not used in the restoration processing by the restoration processing unit 100 described later (an unrestored bit), and will be described in detail later.

A compressed data generation unit 1405 generates compressed data from the encoded image data and the deleted bit.

Note that the configuration of the encoding unit 1401 is not limited to this configuration, and may be configured to support moving image compression standards such as High Efficiency Video Coding (HEVC).

FIG. 15 illustrates the data structure of the compressed data. As illustrated in FIG. 15, the compressed data includes a header portion 1501, an image payload portion 1502, and a deleted bit data portion 1503.

The image payload portion 1502 corresponds to the encoded image data, and the header portion 1501 stores resolution information and the like necessary when decoding the encoded image data.

The deleted bit data portion 1503 is data in which the deleted bit information of each image block is stored, in raster order of the original image and the locally-decoded image. However, the order in which the deleted bit information is stored need not be raster order.

Through the configuration described above, the image encoding unit 1400 generates the compressed data.

The decoding unit 200 decodes the compressed data and generates a decoded image and deleted bit data.

The restoration processing unit 100 performs image quality restoration processing on the basis of the decoded image, which has encoding distortion, and the deleted bit data, and generates an image quality-restored image. Note that the image quality-restored image is in the same image format as the decoded image.

The configuration of the restoration processing unit 100 will be described next.

The image dividing unit 101 scans the decoded image in raster order, divides the image into blocks of N×N pixels, and generates decoded image blocks in order from the upper-left to the lower-right of the decoded image. Note that the image dividing unit 101 may perform any image division that generates blocks at the same pixel positions as the units in which the deleted bit data is obtained. As such, a mirroring processing for creating N×N image blocks also corresponds to the processing performed by the image dividing unit 1403.

The image information determination unit 102 determines the deleted bit in an image block of interest, indicated by the deleted bit data, from the coordinates of the image block generated by the image dividing unit 101, notifies an image processing unit 103 and the coefficient parameter determination unit 104 of the deleted bit for each decoded image block, and notifies the image processing unit 103 of a decoded image block of interest.

The image processing unit 103 generates a processed image block by manipulating a predetermined number of bits from the least significant bit of the decoded image block to reduce the amount of information. Specifically, the image processing unit 103 performs masking processing on the deleted bit in the decoded image block of interest, and generates a processed decoded image block. An image inverse processing unit 106 is also notified of the bit value corresponding to the deleted bit in the decoded image block of interest.

The coefficient parameter determination unit 104 has one or more coefficient parameters used in filter processing performed by the filter processing unit 105, selects coefficient parameters on the basis of the determination result notified by the image information determination unit 102, and notifies the filter processing unit 105 of the coefficient parameters. The present embodiment assumes that coefficient parameters are held and switched for each deleted bit number.

Using the image block notified from the image processing unit 103 and the coefficient parameters notified from the coefficient parameter determination unit 104, the filter processing unit 105 performs filtering processing for restoring the image quality, and generates a filtered image block. Restoration processing is performed on the block of interest as a result of the filtering processing.

The image inverse processing unit 106 performs, on the filtered image block, processing which is the inverse of the image processing performed by the image processing unit 103, and generates an inverse-processed decoded image block. In other words, the bit value of the deleted bit notified from the image processing unit 103 is restored.

FIGS. 16A to 16D illustrate an example of the deleted bit and the image processing.

FIG. 16A illustrates an example of an original image; FIG. 16B, an example of block division; FIG. 16C, an example of deleted bit values determined on a block-by-block basis; and FIG. 16D, a single pixel included in a decoded image block of interest, with changes in the pixel values between before and after the masking.

As illustrated in FIGS. 16A to 16D, if the deleted bit value of the block of interest is 2, the coefficient parameter determination unit 104 selects coefficient parameters corresponding to a deleted bit value of 2, and the image processing unit 103 masks the two most significant bits. The image inverse processing unit 106 performs the inverse processing by concatenating the six least significant bits in the filtered image block with the two most significant bits in the decoded image block.

Note that the bit values of the six least significant bits in the inverse-processed decoded image block are determined on the basis of the filtering processing, and because the values differ depending on the coefficient parameters used, these values are indicated as X, which represents indefinite, in FIG. 16D.

The image combining unit 107 combines the inverse-processed decoded image blocks generated by the image inverse processing unit 106 according to the same coordinate relationships as in the decoded image, and generates the image quality-restored image. An image region produced through the mirroring processing and not needed for the image quality-restored image is discarded by the image combining unit 107.

The image quality-restored image is generated in this manner.

Note that the present embodiment describes an example of filter processing using deep learning, where the filter processing unit 105 is constituted by a neural network, and the coefficient parameters determined by the coefficient parameter determination unit 104 are coefficient parameters that have been learned in advance through machine learning.

The processing of the filter processing unit 105 corresponds to inferencing processing in the deep learning, and the image quality-restored image is generated in units of image blocks by performing the image restoration processing through the inferencing processing.

In the following, the inferencing processing and the image restoration processing will be treated as being equivalent.

Although the neural network mentioned above is assumed to be constituted by a Convolutional Neural Network (CNN) and a fully-connected layer, the neural network is not limited thereto.

Furthermore, the coefficient parameters mentioned above correspond to weights, biases, and so on of edges connecting the nodes in each layer in the fully-connected layer, and the weights, biases, and so on in the kernel of the CNN. In the present embodiment, these parameters are updated through learning in the neural network, and are collectively referred to as "coefficient parameters".

The image quality restoration processing for a decoded image having encoding distortion is performed through the configuration described above.

Method for Determining Deleted Bit

Because the image restoration processing is performed with the goal of overcoming encoding distortion, there is no need to restore pixels which are not different between the original image and the decoded image. Extending the same interpretation to pixel bits, there is no need to restore bits which are not different between the original image and the decoded image. Accordingly, in the present embodiment, for each image block, masking processing is performed on the bits above the maximum bit position where a difference occurs between the original image and the decoded image (i.e., the masking processing is performed on more significant bits where no difference between the original image and the decoded image occurs). However, because the original image cannot be used at the point in time when the image restoration is performed, in the present embodiment, the image encoding unit 1400 determines, on an image block-by-image block basis, the bits on which to perform the masking processing using the locally-decoded image.

A method for determining the deleted bit will be described hereinafter with reference to the flowchart in FIG. 17.

Figure 17:
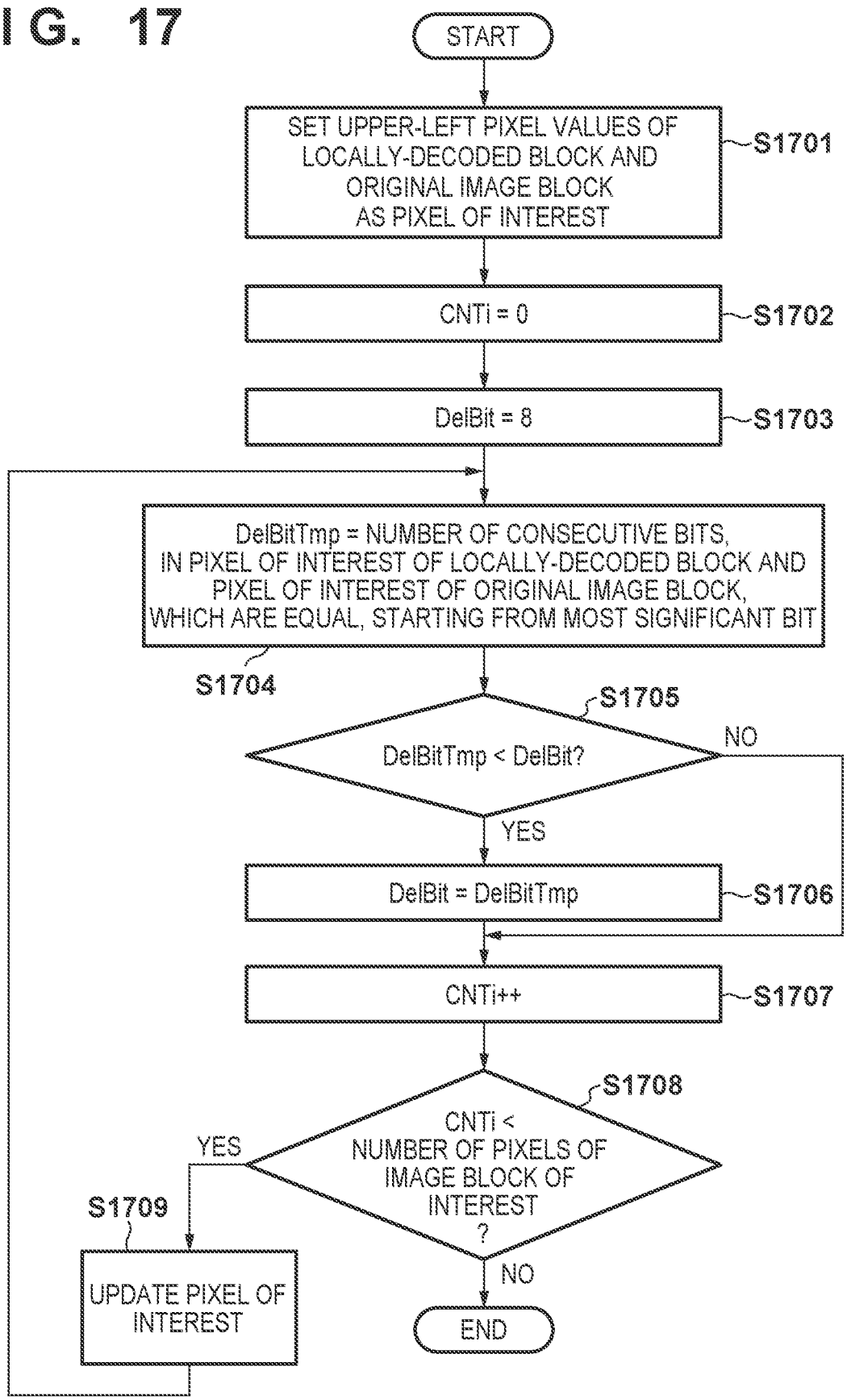
FIG. 17 is a flowchart illustrating processing performed by a deleted bit determination unit according to the ninth embodiment.

FIG. 17 is a flowchart illustrating processing through which the deleted bit determination unit 1404 determines a deleted bit.

In step S1701, the deleted bit determination unit 1404 reads out the upper-left pixel values of a locally-decoded block and original image block of interest, and takes those pixels as pixels of interest.

In step S1702, the deleted bit determination unit 1404 resets an increment counter CNTi to 0.

In step S1703, the deleted bit determination unit 1404 resets a deleted bit DelBit to 8. Note that the value of 8 is the bit depth of the decoded image, and thus DelBit is 10 in the case of a 10-bit image.

In step S1704, the deleted bit determination unit 1404 stores the number of consecutive bits, in the locally-decoded block and the original image block, which are equal, starting from the most significant bit, as DelBitTmp.

FIG. 18 illustrates an example of locally-decoded block and original image block pixel values.

With the pixel values in FIG. 18, the pixel values of the locally-decoded image block and the pixel values of the original image block are the same for the two most significant bits, and thus DelBitTmp is 2.

In step S1705, the deleted bit determination unit 1404 moves the sequence to step S1706 if DelBitTmp<DelBit (YES in step S1705), and to step S1707 if not (NO in step S1705).

In step S1706, the deleted bit determination unit 1404 sets DelBit to DelBitTmp.

In step S1707, the deleted bit determination unit 1404 increments the increment counter CNTi by 1.

In step S1708, if CNTi<number of pixels in the image block of interest (YES in step S1708), the deleted bit determination unit 1404 moves the sequence to step S1709, and ends the sequence if not (NO in step S1708).

In step S1709, the deleted bit determination unit 1404 updates the pixel of interest to the pixel adjacent in raster order, and returns to step S1704.

By doing so, common more significant bits which have no differences between the locally-decoded block and original image block of interest can be detected, and more significant bits which can be masked can therefore be confirmed. Applying this processing to all blocks makes it possible to generate the deleted bit data of the decoded image.

Method of Learning Coefficient Parameters

Figure 19:
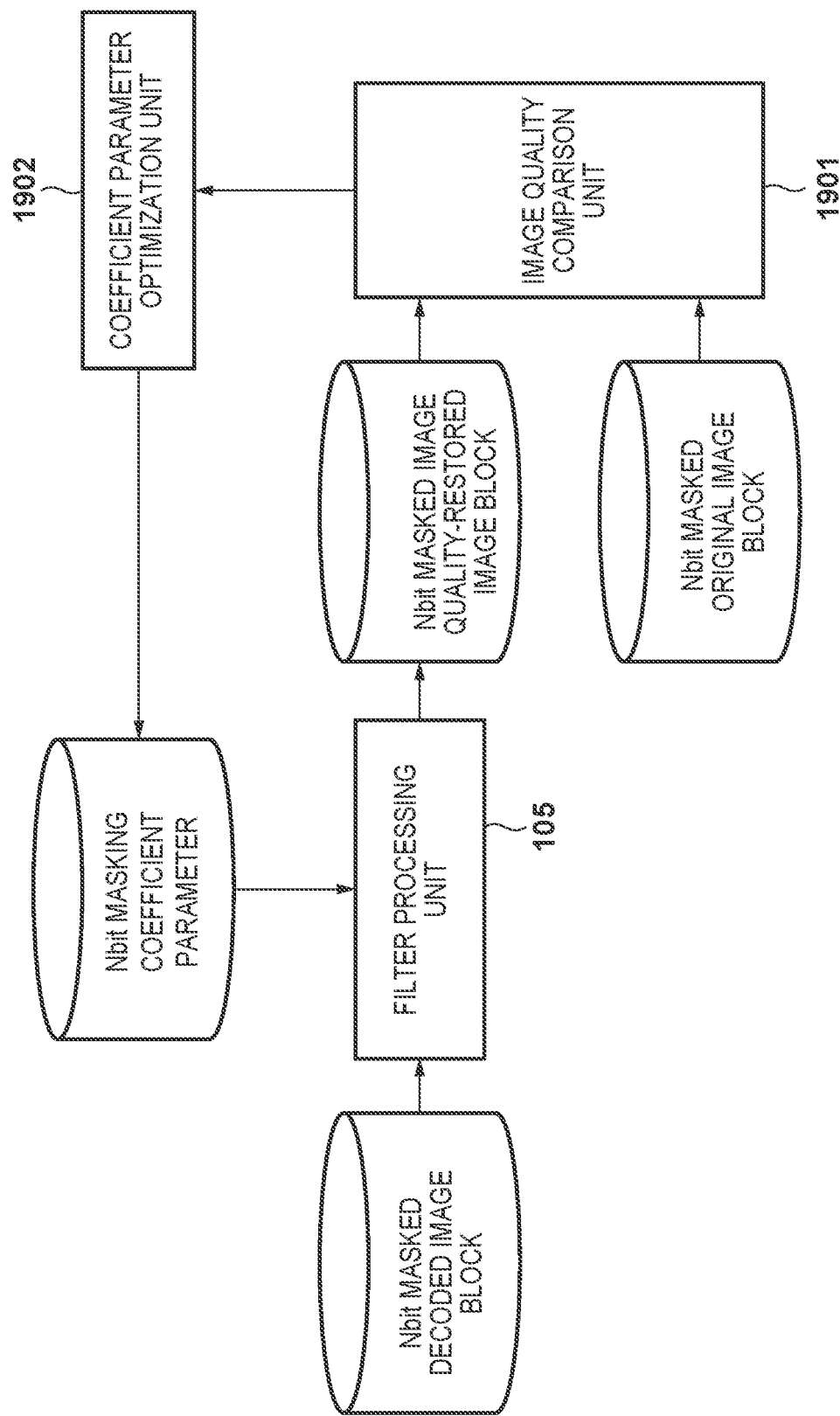
FIG. 19 is a block diagram illustrating an example of a configuration of a learning unit according to the ninth embodiment.

FIG. 19 illustrates an example of the configuration of a learning unit which learns the coefficient parameters. Elements that are the same as in FIG. 14 are given the same reference signs.

As illustrated in FIG. 19, elements of the restoration processing unit 100 aside from the filter processing unit 105 are not needed for the learning. The present embodiment assumes that the image has been divided into image blocks and the masking processing has already been performed through the method described with reference to FIG. 17, and that a training image set for obtaining the coefficient parameters has been prepared in advance.

"Nbit" in FIG. 19 is the deleted bit determined through the method described with reference to FIG. 17. It is assumed that the deleted bits are calculated for a population of images which are to be learned prior to the learning, and training image sets for each of the deleted bits are prepared in advance.

The learning unit illustrated in FIG. 19 first inputs an Nbit masked decoded image and an Nbit masking coefficient parameter, and executes filtering processing using the filter processing unit 105.

An image quality comparison unit 1901 compares the image quality of an Nbit masked image quality-restored image block, which is the filtered image generated by the filter processing unit 105, with an Nbit masked original image block, and notifies a coefficient parameter optimization unit 1902 of a result of the comparison.

Although the present embodiment assumes that the image quality comparison unit 1901 uses the mean squared error (mse) of the Nbit masked image quality-restored image block and the Nbit masked original image block as an indicator of the image quality, the indicator need not be limited to the mse, and any indicator of image quality may be used.

The coefficient parameter optimization unit 1902 updates the Nbit masking coefficient parameter on the basis of the comparison result.

Because the decoded image having the highest image quality corresponds to the quality of the original image before encoding, the learning according to the present embodiment repeats processing which feeds back to the coefficient parameters so that the image output by the neural network approaches the original image.

The present embodiment assumes that the coefficient parameter optimization unit 1902 obtains a gradient, which is an amount of change in the coefficient parameter, through error back propagation, and updates the coefficient parameter using stochastic gradient descent as the method for optimizing the parameter.

Although the method of updating the coefficient parameters is one way through which the neural network learns, other methods may be used to obtain the gradient, optimize the parameters, and so on.

By repeating the above-described processing recursively on the training image set prepared in advance while updating the coefficient parameters, coefficient parameters which are suited to an image subjected to Nbit masking can be generated.

By masking the more significant bits which are not needed in the inferencing processing as described above, redundant image information can be reduced, and by reducing the number of image patterns which are to be learned as coefficient parameters, the restoration performance in the inference can be improved.

Furthermore, the restoration processing unit 100 can hold the coefficient parameters obtained through the above-described learning in the coefficient parameter determination unit 104 and switch the parameters in accordance with the value of the deleted bit, which makes it possible to perform the inferencing processing with optimal coefficient parameters in accordance with the masking amount. This also makes it possible to improve the restoration performance.

In this manner, the image restoration processing can be performed having ignored more significant bits in the original image and the decoded image, which do not require inferencing processing, as specific bit data in the decoded image which need not be subject to image restoration, and this makes it possible to improve the post-image restoration image quality.

Note that the image encoding unit 1400 may also record the deleted bit data in a compressed state. However, doing so means the decoding unit 200 will need to decode the deleted bit data as well. Although the present embodiment describes an example of learning the coefficient parameters in advance in accordance with a masking amount, the configuration is not limited thereto. A single coefficient parameter may be prepared without regard for the masking amount, or coefficient parameters for a masking amount 1 and a masking amount 2 may be generated through the same learning, and then used by the restoration processing unit 100. Although this does produce a tradeoff with the image quality restoration performance, the size of the coefficient parameters can also be reduced.

Although the present embodiment describes an example of a data structure in which the deleted bit data is included as portion of the compressed data, the configuration is not limited thereto, and may be such that the restoration processing unit 100 is notified of the deleted bit data as independent data.

If the image is in the YUV format, a method in which the restoration processing is performed only on the Y component, which has a high impact on the subjective image quality, is conceivable as well. In such a case, it is sufficient for the restoration processing unit 100 to take only the Y component of the decoded image as an input and perform the image restoration, and for the deleted bit determined by the image encoding unit 1400 to be calculated from only the Y component.

Note that when performing the restoration processing on each of the Y, U, and V components in the YUV format, the restoration processing according to the present embodiment may be applied to Y, U, and V in order, or the restoration processing unit may be given a three-core configuration and perform the processing in parallel.

Tenth Embodiment

A tenth embodiment will be described hereinafter.

Figure 20:
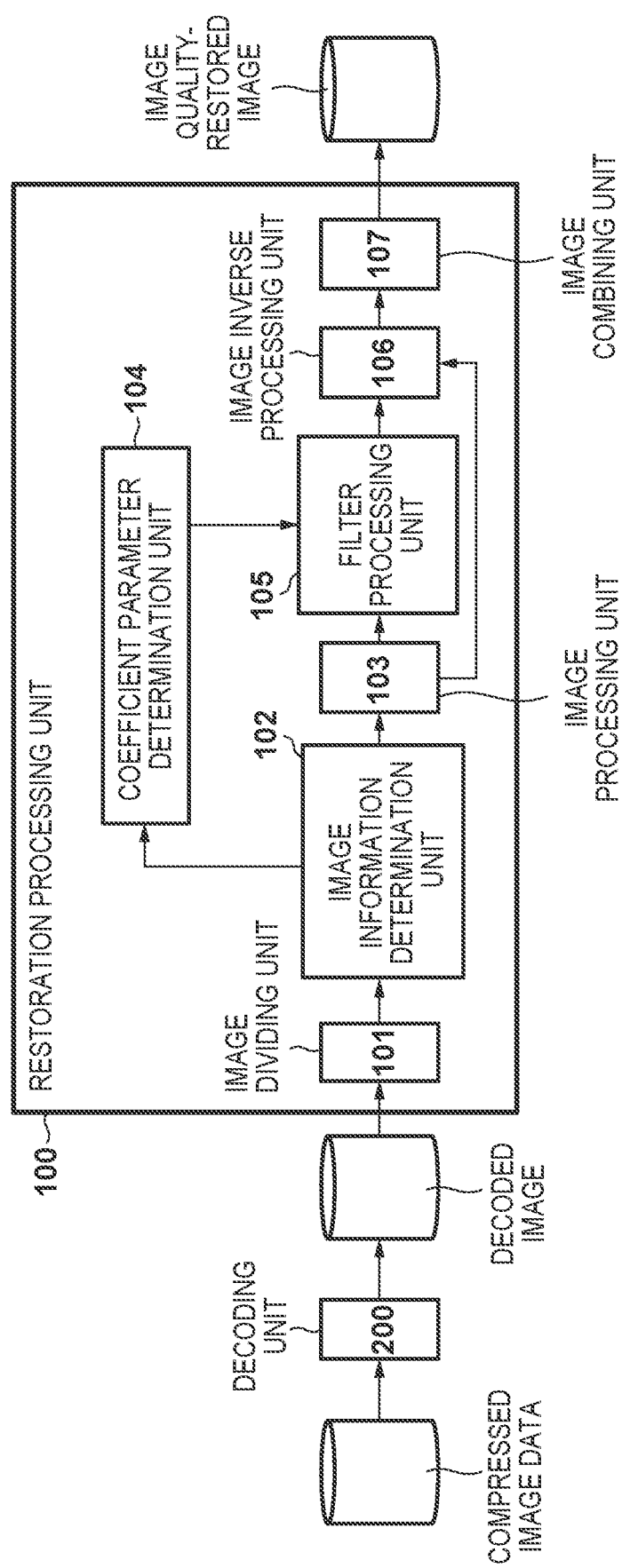
FIG. 20 is a block diagram illustrating an example of a configuration of a signal processing apparatus according to a tenth embodiment.

FIG. 20 is a block diagram illustrating an example of the configuration of a signal processing apparatus according to the tenth embodiment. Elements that are the same as in FIG. 14 are given the same reference signs.

The present embodiment differs from the ninth embodiment in that information used in image processing is stored at the point in time when the image is encoded, and therefore not needed to notify the restoration processing unit 100.

Figure 21:
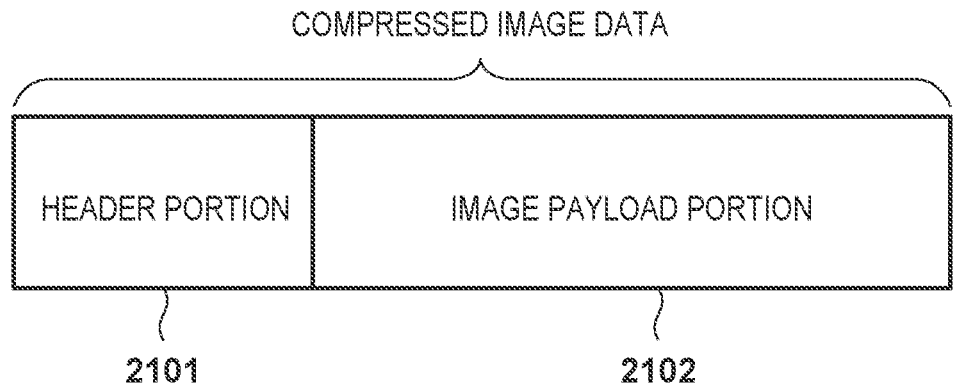
FIG. 21 is a diagram illustrating the data structure of compressed image data according to the tenth embodiment.

FIG. 21 illustrates the data structure of compressed image data. As illustrated in FIG. 21, the data is constituted by a header portion 2101 and an image payload portion 2102, and the image payload portion 2102 is the encoded image data illustrated in FIG. 14. The compressed image data does not contain supplementary information or the like handled by the restoration processing unit 100. In the present embodiment, the restoration processing unit 100 determines an image processing method using the image information determination unit 102.

Method by which Image Information Determination Unit 102 Determines Image Information The image quality-restored image is constituted by a bit string in which each pixel has a fixed bit depth, and the degree of encoding distortion can be found according to the magnitude of the difference from the original image with respect to each pixel value.

The closer to the least significant bit (LSB) a bit is, the smaller the drop in image quality will be, even if there is a difference between the original image and the image quality-restored image.

Accordingly, in the present embodiment, the restoration processing is performed having masked M consecutive bits on the LSB side. The masking amount will be represented by "M" hereinafter. M is an integer greater than or equal to 1, and may be determined in accordance with the format of the image to be restored, the target subjective image quality, and so on.

Human visual characteristics make it difficult to see a drop in the image quality of complex images having high spatial frequencies.

Additionally, considering an image having image features in which the pixel value average is low and the image is dark and an image having image features in which the pixel value average is high and the image is bright, when subjectively comparing an original image with a decoded image, it is difficult to recognize degradation in the image which has the relatively higher pixel value average and which is brighter if the difference between the average pixel values of the original image and the decoded image is the same.

Accordingly, in the present embodiment, the masking amount from the LSB side is increased for complex image blocks having high levels of variance, and for image blocks having higher pixel value averages and which are brighter.

Figure 22:
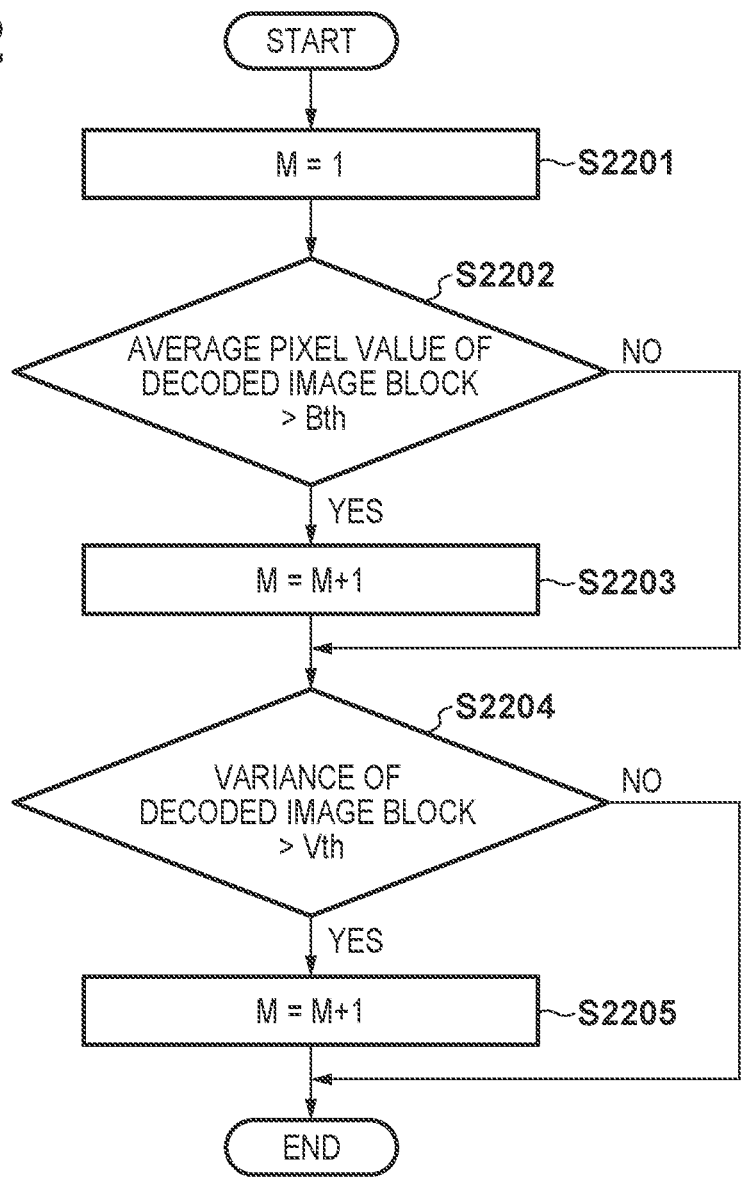
FIG. 22 is a flowchart illustrating processing performed by an image information determination unit according to the tenth embodiment.

A method through which the image information determination unit 102 determines the masking amount M on the LSB side will be described next with reference to the flowchart in FIG. 22.

In step S2201, the image information determination unit 102 sets M to 1.

In step S2202, if an average pixel value of a decoded image block of interest is greater than a predetermined threshold Bth (YES in step S2202), the image information determination unit 102 moves the sequence to step S2203, and if not (NO in step S2202), the image information determination unit 102 moves the sequence to step S2204.

In step S2203, the image information determination unit 102 sets M to M+1.

In step S2204, if the average pixel value of the decoded image block of interest is greater than a predetermined threshold Vth (YES in step S2204), the image information determination unit 102 moves the sequence to step S2205, and if not (NO in step S2204), the image information determination unit 102 ends the sequence.

In step S2205, the image information determination unit 102 sets M to M+1.

Performing the processing described above results in masking amounts M such as the following.

Low variance, low pixel value average: M=1
Low variance, high pixel value average: M=2
High variance, low pixel value average: M=2
High variance, high pixel value average: M=3

By doing so, the LSB masking amount can be increased for image blocks in which image quality drops are less visible due to the visual characteristics of humans.

FIG. 23 illustrates an example of an LSB mask according to the present embodiment. As illustrated in FIG. 23, the image processing unit 103 masks the M consecutive bits from the LSB, in accordance with the value of M.

Note that the coefficient parameter determination unit 104 holds the coefficient parameters generated through learning using masked images for each class in accordance with the above-described image classification performed by the image information determination unit 102, and switches the coefficient parameter in accordance with the masking amount M.

The image inverse processing unit 106 is notified of the pixel values of the decoded image block from the image processing unit 103, and the image inverse processing unit 106 then performs the inverse processing by concatenating the 8−M most significant bits in the filtered image block with the M least significant bits in the decoded image block.

In this manner, the image restoration processing can be performed having ignored less significant bits in the original image and the decoded image, which do not require inferencing processing, as specific bit data in the decoded image which from the perspective of subjective image quality need not be subject to image restoration, and this makes it possible to improve the post-image restoration image quality.

Note that the restoration processing may be performed by performing both the masking processing for the more significant bits, described in the ninth embodiment, and the masking processing for the less significant bits, described in the present embodiment, on the same decoded image block. Note also that in a configuration which includes the image encoding unit 1400, such as that illustrated in FIG. 14, the image encoding unit 1400 may determine the masking amount for the less significant bits, and deleted bit data may be added to the compressed data, in the same manner as in the ninth embodiment.

Additionally, the processing of the image processing unit 103 may be processing for shifting bits rather than masking. In other words, the number of bits may be reduced by performing the restoration processing using a processed image block shifted to the right by a shift amount equivalent to the M least significant bits determined to be unnecessary.

Eleventh Embodiment

An eleventh embodiment will be described hereinafter.

Figure 24:
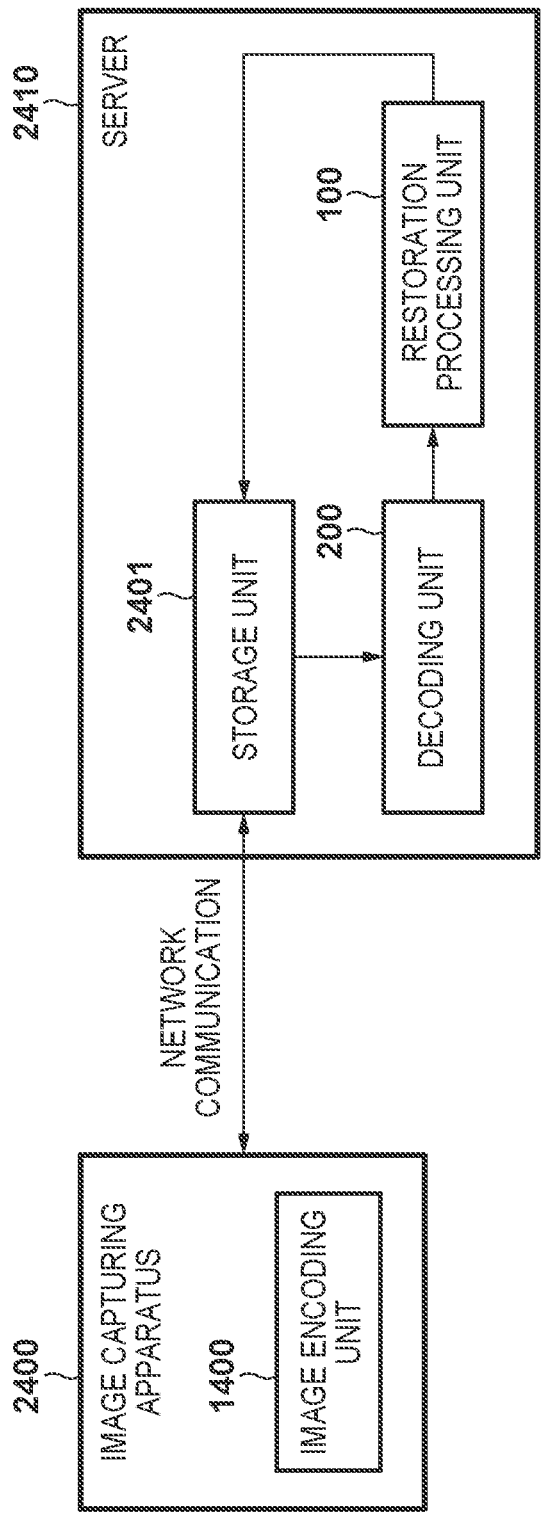
FIG. 24 is a block diagram illustrating an example of a system configuration according to an eleventh embodiment.

FIG. 24 illustrates the configuration of a signal processing system in which an image capturing apparatus and a server 2410 are communicably connected, according to the eleventh embodiment. As illustrated in FIG. 24, in the present embodiment, the image encoding unit 1400 is provided in an image capturing apparatus 2400. Meanwhile, the decoding unit 200 and the restoration processing unit 100 are provided in a server 2410.

The server 2410 also includes a storage unit 2401 constituted by a storage device.

The image capturing apparatus 2400 is configured to be capable of connecting to the server 2410 over a network. In the present embodiment, the configuration is such that an image captured by the image capturing apparatus 2400 is encoded by the image encoding unit 1400, and the resulting compressed data can be transmitted to the server 2410 through network communication and stored in the storage unit 2401. A user who wishes to display or output a captured image can obtain the image by having the server 2410 perform decoding and restoration processing on the compressed data, which is captured image data on the server 2410.

Note that the image capturing apparatus 2400 and the server 2410 can notify of information aside from images with each other, and using the fact that information can be exchanged through network communication, the deleted bit data can also be transmitted to the server 2410 as an independent file.

As described above, even if the image encoding unit 1400 and the restoration processing unit 100 are separate devices, the image restoration processing can be performed having ignored less significant bits in the original image and the decoded image, which do not require inferencing processing, as specific bit data in the decoded image, and this makes it possible to improve the post-image restoration image quality.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-219076, filed Dec. 3, 2019 which is hereby incorporated by reference herein in its entirety.

What is claimed is:

1. A signal processing apparatus comprising:
a local decoding unit configured to generate lossy compressed image data, and generate a locally-decoded image;
a decoding unit configured to generate a decoded image by decoding the lossy compressed image data; and
a restoration processing unit configured to perform image restoration processing on the decoded image,
wherein an encoding unit configured to calculate a maximum bit position where a difference occurs between each pixel of the locally-decoded image and an original image, the original image being an image before encoding, for each of predetermined blocks, and calculate a bit greater than or equal to the maximum bit position as an unrestored bit, and the decoding unit, are capable of communicating over a network, and are capable of transmitting and receiving at least the lossy compressed image data, the decoded image, and the unrestored bit, and
wherein the restoration processing unit determines whether or not to perform the restoration processing for each of blocks in the decoded image in accordance with specific image information, and for a block on which it is determined that the restoration processing is to be performed, performs the restoration processing on the basis of an inference made using a coefficient learned in advance.

2. The apparatus according to claim 1,
wherein the coefficient learned in advance is learned and obtained for each of instances of the specific image information; and
the restoration processing unit does not perform the restoration processing on image information which has a restoration performance lower than a predetermined level at the point in time of the learning.

3. The apparatus according to claim 1,
wherein the specific image information is at least one of luminance information and spatial frequency information.

4. The apparatus according to claim 1,
wherein the restoration processing unit receives quantization information pertaining to the decoded image, and on the basis of the quantization information, does not perform the restoration processing on a block having a quantization value lower than a predetermined value.

5. The apparatus according to claim 1, further comprising:
an encoding unit including a quantization unit configured to quantize image data and a quantization control unit configured to determine a quantization value in predetermined units of blocks, the encoding unit configured to generate encoded data by lossy-compressing the image data,
wherein the quantization control unit calculates the specific image information and determines the quantization value in accordance with the calculated image information.

6. The apparatus according to claim 5,
wherein the restoration processing unit is notified of the specific image information calculated by the encoding unit; and
the restoration processing unit performs the restoration processing in accordance with the image information notified from the encoding unit.

7. The apparatus according to claim 5,
wherein the quantization control unit lowers the quantization value of a block having specific image information on which the restoration processing unit does not perform the restoration processing.

8. The apparatus according to claim 5,
wherein the quantization control unit determines a size of the blocks, which are a unit of quantization control, in accordance with the specific image information.

9. The apparatus according to claim 1, further comprising:
a component conversion unit configured to convert the decoded image into at least two components; and
an inverse component conversion unit configured to convert the component obtained from the conversion into data of a same image format as the decoded image,
wherein the restoration processing unit performs the restoration processing for each component obtained from the conversion performed by the component conversion unit, and generates a color component to restore; and
the inverse component conversion unit performs inverse component conversion on the color component to restore, and generates a restored image.

10. The apparatus according to claim 9,
wherein the component conversion unit converts the decoded image into color components constituted by at least red, green, and blue; and
the specific image information is information of green, among the at least red, green, and blue color components generated by the component conversion unit.

11. The apparatus according to claim 9,
wherein the component conversion unit converts the decoded image into color components constituted by at least luminance and color difference; and
the specific image information is luminance information, among the components generated by the component conversion unit.

12. The apparatus according to claim 1, further comprising:
an image processing unit configured to process an image in units of blocks and generate a processed image block,
wherein the processed image block is generated by manipulating a predetermined bit of the decoded image block and reducing an amount of information, and the restoration processing unit performs the image restoration processing on the processed image block.

13. The apparatus according to claim 12,
wherein
the restoration processing unit performs the image restoration processing using the unrestored bit.

14. The apparatus according to claim 13,
wherein
the restoration processing unit performs the image restoration processing on an image block in which the unrestored bit has been masked by the image processing unit.

15. The apparatus according to claim 12,
wherein the image processing unit masks or shifts a predetermined number of bits from a less significant bit of the decoded image block; and
the predetermined number of bits is higher the higher the luminance of the decoded image block is.

16. The apparatus according to claim 12,
wherein the image processing unit masks or shifts a predetermined number of bits from a least significant bit of the decoded image block; and
the predetermined number of bits is higher the higher the spatial frequency of the decoded image block is.

17. The apparatus according to claim 12,
wherein the restoration processing unit has at least two of the coefficients learned in advance, and switches the coefficients in accordance with manipulation of a predetermined bit performed by the image processing unit.

18. A signal processing method comprising:
generating lossy compressed image data, and generate a locally-decoded image;
generating a decoded image by decoding the lossy compressed image data by a decoding processing; and
performing image restoration processing on the decoded image,
wherein in an encoding processing, calculating a maximum bit position where a difference occurs between each pixel of the locally-decoded image and an original image, the original image being an image before encoding, for each of predetermined blocks, and calculating a bit greater than or equal to the maximum bit position as an unrestored bit, and the wherein the encoding processing and the decoding processing are capable of communicating over a network and are capable of transmitting and receiving at least the lossy compressed image data, the decoded image, and the unrestored bit, and
wherein in the restoration processing, it is determined whether or not to perform the restoration processing for each of blocks in the decoded image in accordance with specific image information, and for a block on which it is determined that the restoration processing is to be performed, the restoration processing is performed on the basis of an inference made using a coefficient learned in advance.

* * * * *